(12) United States Patent
Kamikawa et al.

(10) Patent No.: US 12,051,765 B2
(45) Date of Patent: Jul. 30, 2024

(54) METHOD FOR REMOVAL OF DEVICES USING A TRENCH

(71) Applicant: The Regents of the University of California, Oakland, CA (US)

(72) Inventors: Takeshi Kamikawa, Santa Barbara, CA (US); Srinivas Gandrothula, Santa Barbara, CA (US); Masahiro Araki, Santa Barbara, CA (US)

(73) Assignee: THE REGENTS OF THE UNIVERITY OF CALIFORNIA, Oakland, CA (US)

( * ) Notice: Subject to any disclaimer, the term of this patent is extended or adjusted under 35 U.S.C. 154(b) by 487 days.

(21) Appl. No.: 17/422,807

(22) PCT Filed: Jan. 16, 2020

(86) PCT No.: PCT/US2020/013934
§ 371 (c)(1),
(2) Date: Jul. 14, 2021

(87) PCT Pub. No.: WO2020/150511
PCT Pub. Date: Jul. 23, 2020

(65) Prior Publication Data
US 2022/0123166 A1    Apr. 21, 2022

Related U.S. Application Data

(60) Provisional application No. 62/793,253, filed on Jan. 16, 2019.

(51) Int. Cl.
*H01L 33/00*    (2010.01)
*H01L 33/28*    (2010.01)

(52) U.S. Cl.
CPC ...... *H01L 33/0093* (2020.05); *H01L 33/0075* (2013.01); *H01L 33/28* (2013.01)

(58) Field of Classification Search
None
See application file for complete search history.

(56) References Cited

U.S. PATENT DOCUMENTS

| 6,617,261 B2 | 9/2003 | Wong et al. |
| 2002/0013036 A1 | 11/2002 | Gehrke et al. |

(Continued)

FOREIGN PATENT DOCUMENTS

| EP | 3051575 | 8/2016 |
| EP | 3051575 A1 | 8/2016 |

(Continued)

OTHER PUBLICATIONS

Extended European Search Report dated Feb. 2, 2022 for EP Application No. 20741264.4.

(Continued)

*Primary Examiner* — Evren Seven
(74) *Attorney, Agent, or Firm* — Gates & Cooper LLP

(57) ABSTRACT

An epitaxial lateral overgrowth (ELO) layer is grown on an opening area of a substrate, wherein the ELO layer is higher than a surface 5 of a trench in the substrate. The trench is apt to form a symmetric shape of the ELO layer, which renders it suitable for flip-chip bonding The shape of the ELO layer has a depressed surface region at a back side of a bar formed by the ELO layer. A cleaving point is located higher than the bottom of the ELO layer, so that a force can be efficiently applied to 10 the cleaving point for removing the bar.

11 Claims, 39 Drawing Sheets

(56) References Cited

U.S. PATENT DOCUMENTS

| | | |
|---|---|---|
| 2009/0035534 A1 | 2/2009 | Su et al. |
| 2009/0180505 A1 | 7/2009 | Kohda et al. |
| 2011/0045658 A1 | 2/2011 | Liu et al. |
| 2012/0190148 A1 | 7/2012 | Lin et al. |
| 2013/0037857 A1 | 2/2013 | Kanel et al. |
| 2020/0194615 A1* | 6/2020 | Kamikawa .............. H01L 24/80 |

FOREIGN PATENT DOCUMENTS

| | | |
|---|---|---|
| WO | 2018031876 A1 | 2/2018 |
| WO | 2018204916 A1 | 11/2018 |

OTHER PUBLICATIONS

Japanese Notice of Reasons for Rejection (with English translation) for Japanese Patent Application No. 2021-541054.
Chinese Office Action dated Aug. 18, 2023 for Chinese Application No. 202080014791.7.
PCT International Search Report and Written Opinion dated Apr. 7, 2020 for PCT Application No. PCT/US20/13934.
Japanese Notice of Reasons for Rejection (with English translation) dated May 15, 2023 for Japanese Patent Application No. 2021-541054.

\* cited by examiner

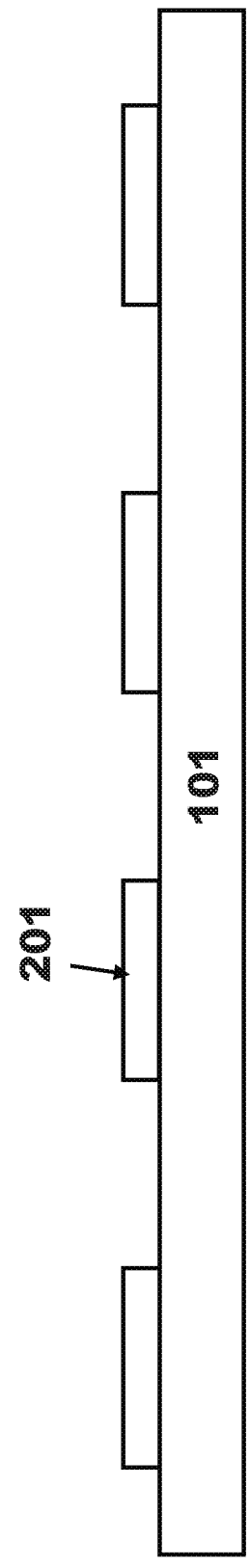

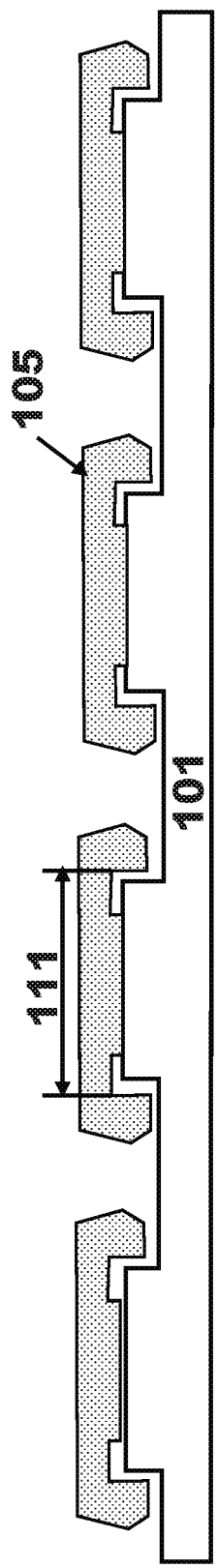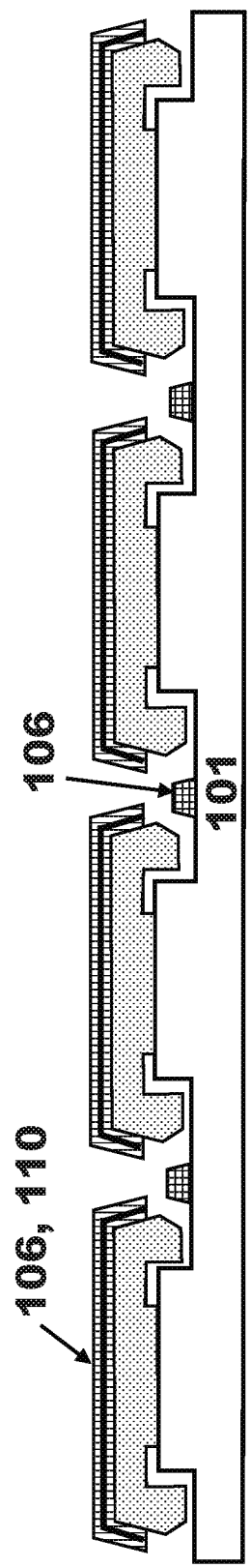

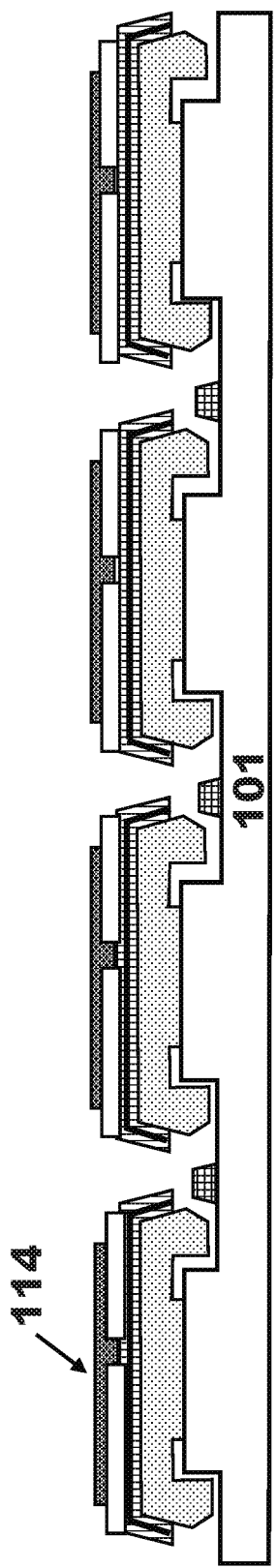
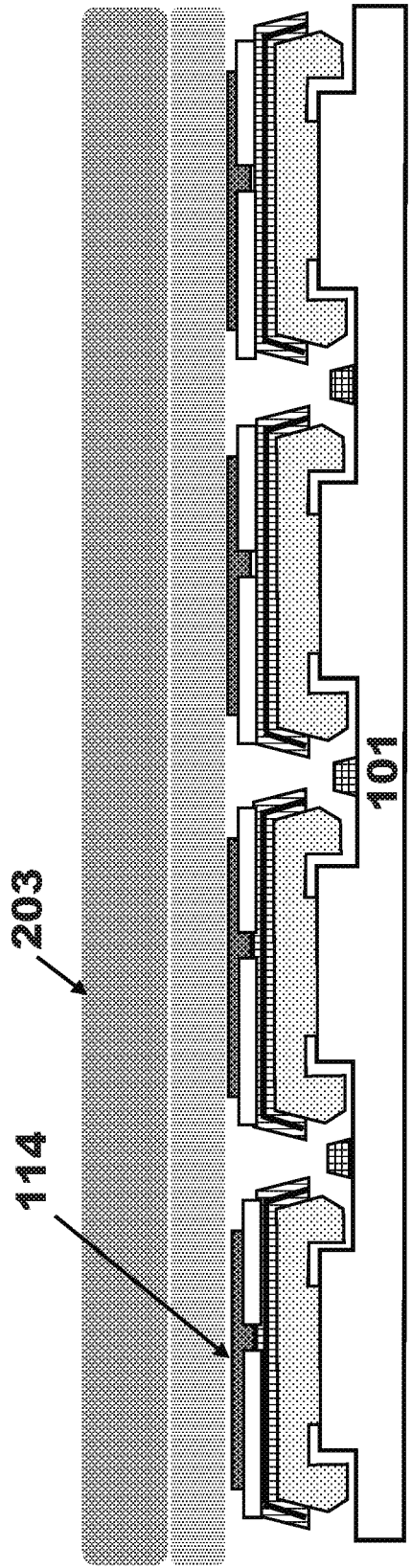

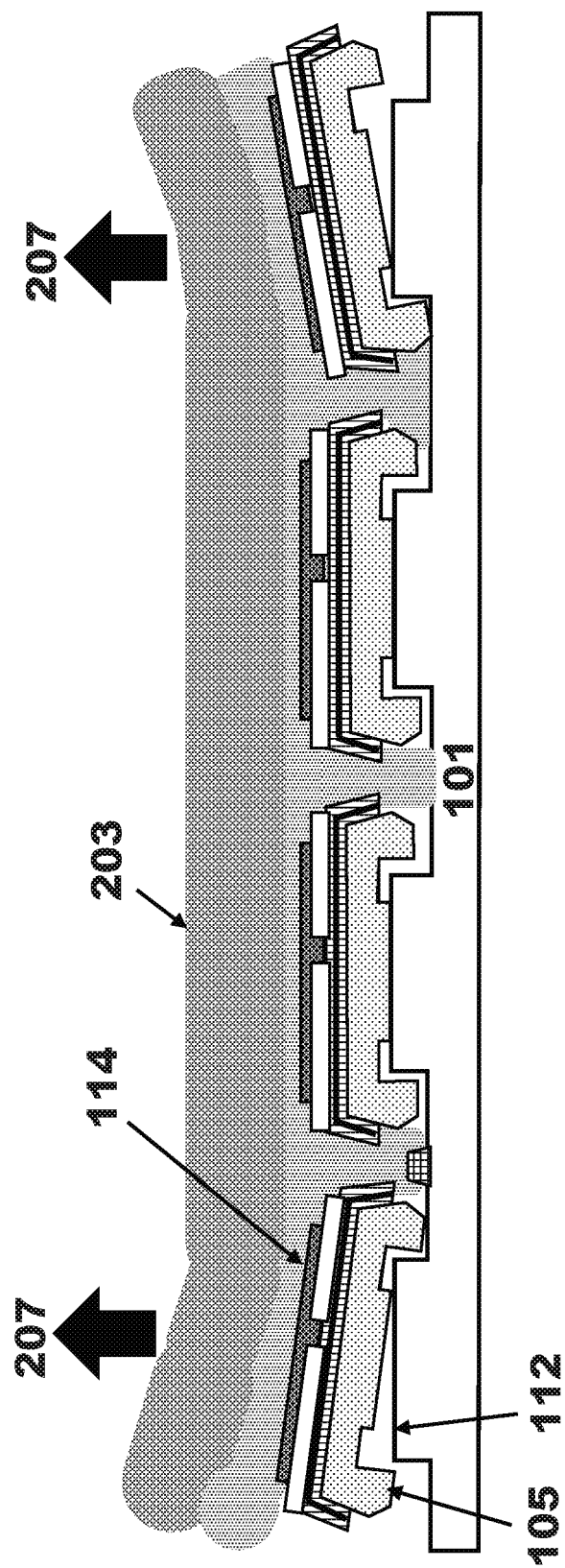

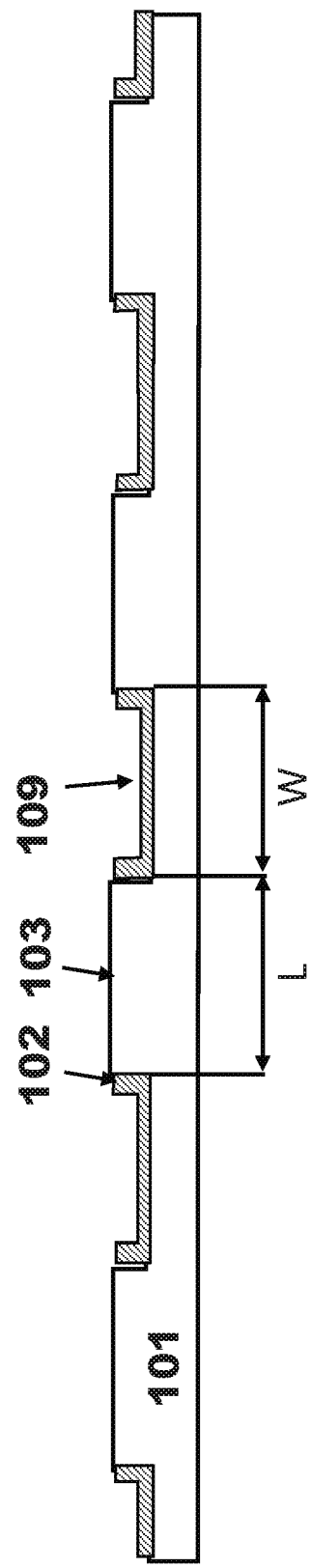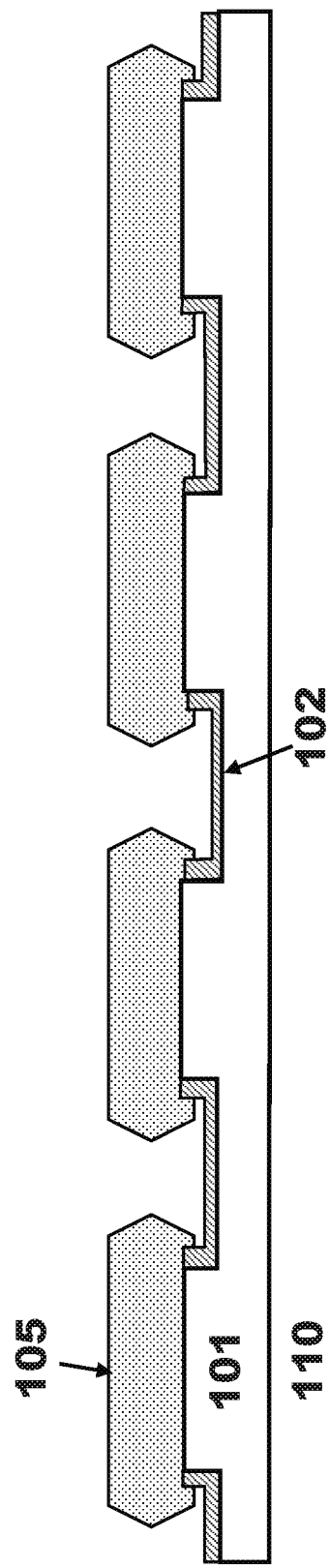
Fig. 4(a)
Fig. 4(b)

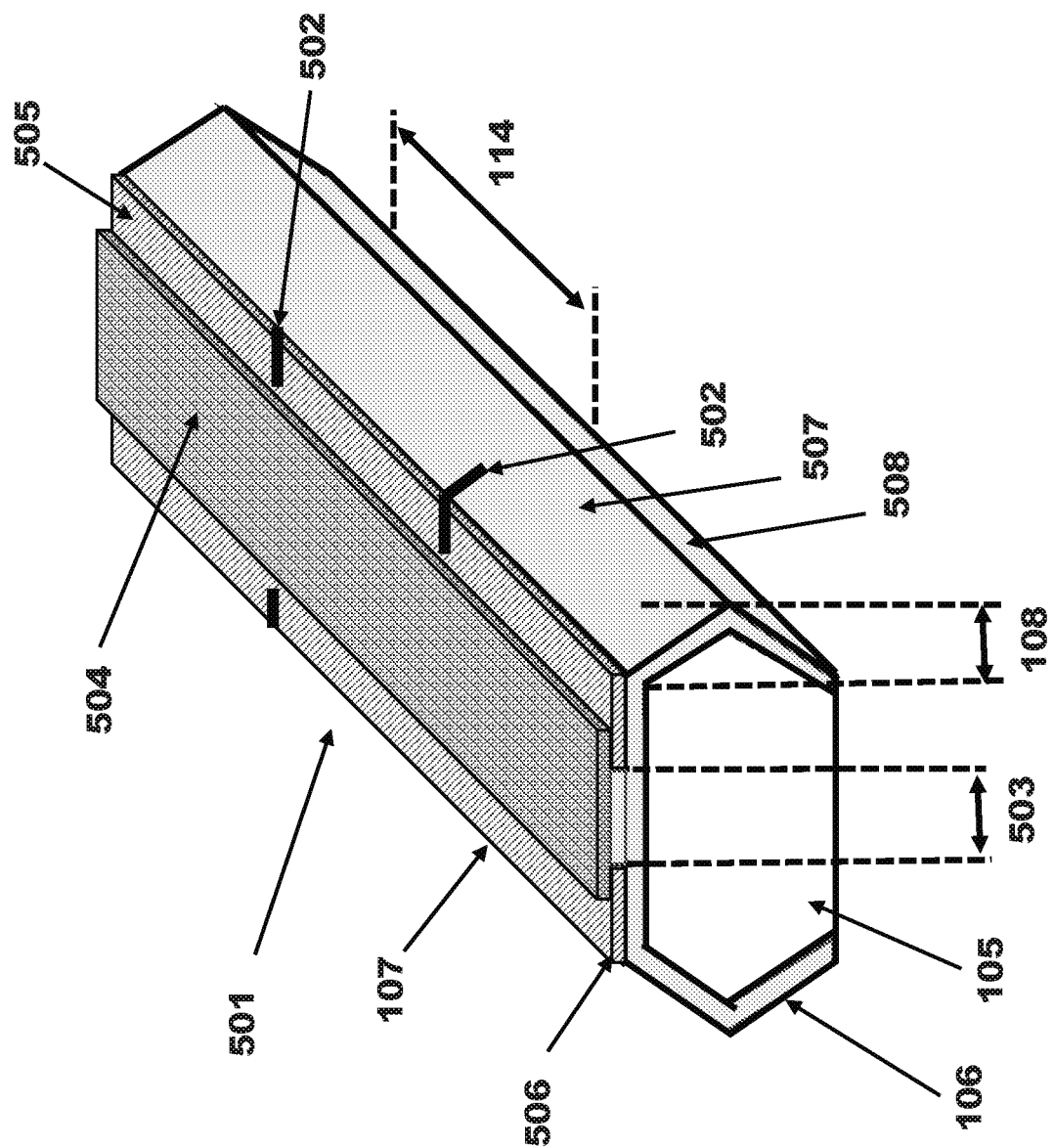

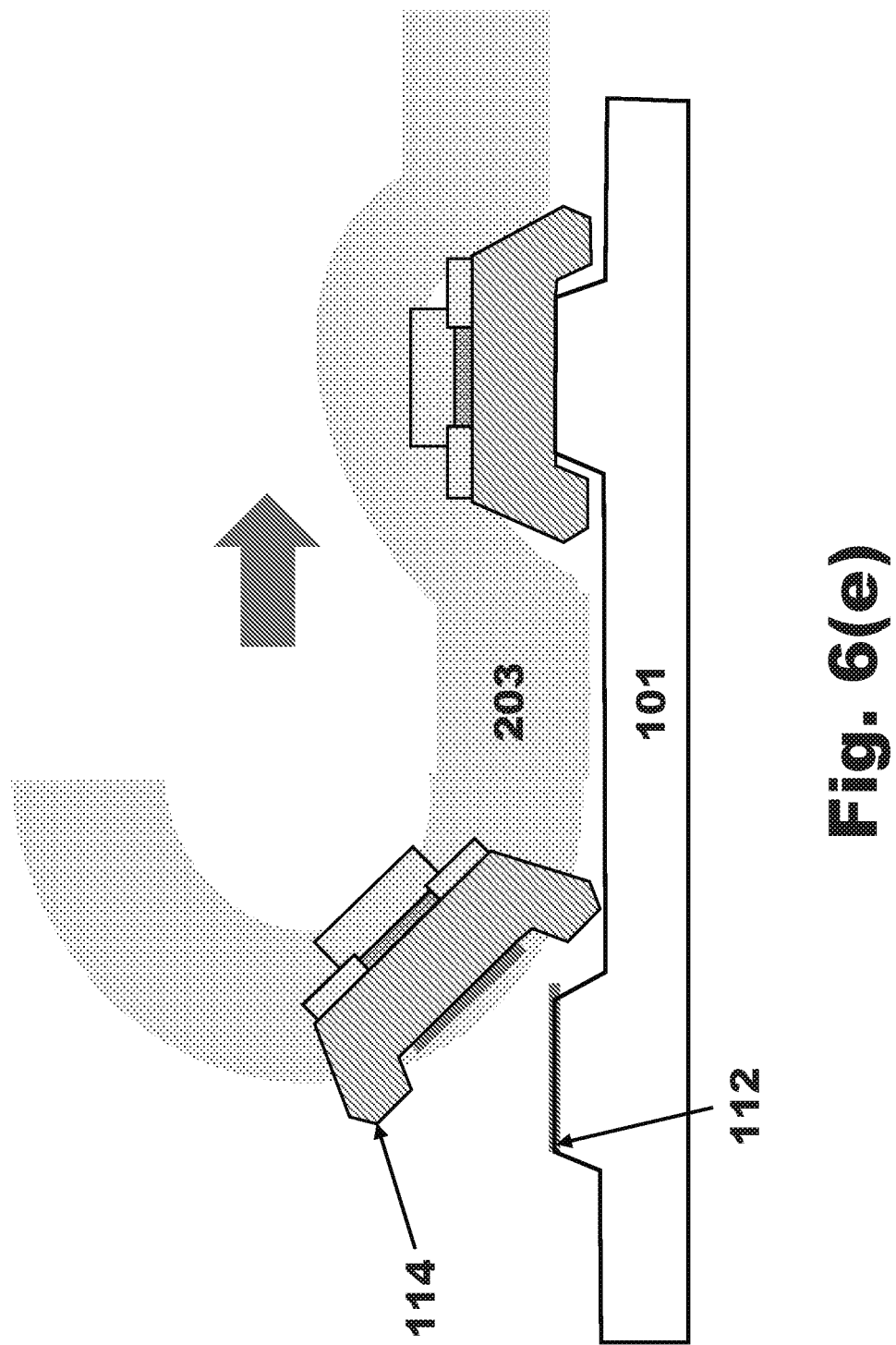

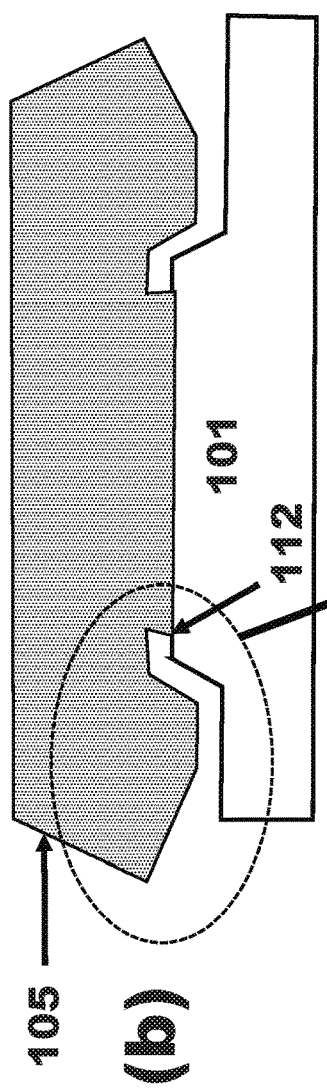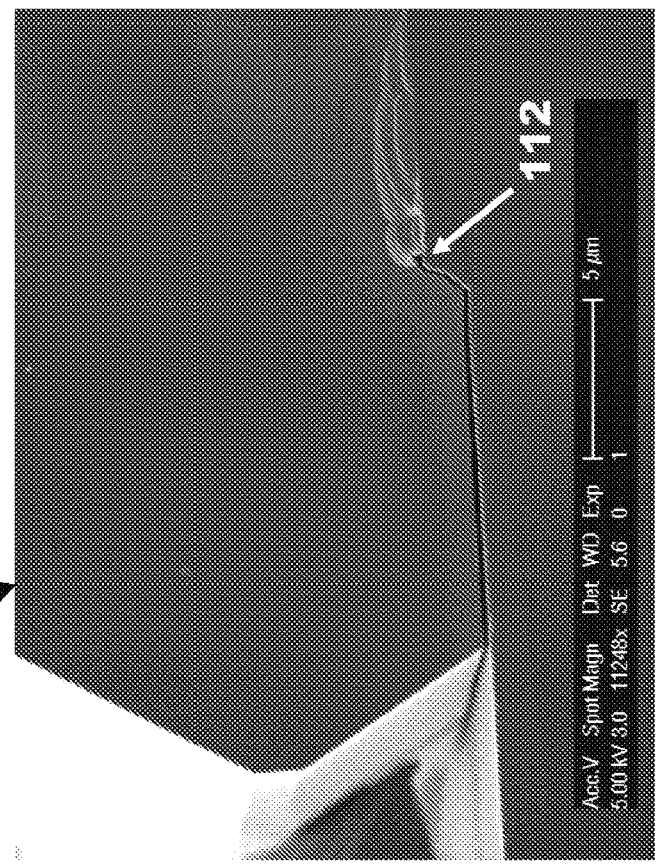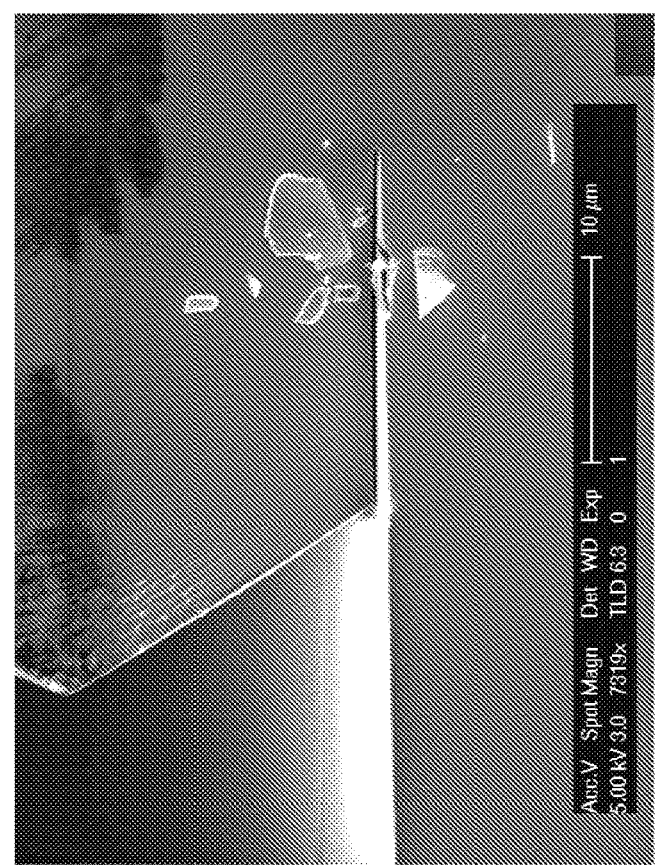
Fig. 7(a)
Fig. 7(b)
Fig. 7(c)

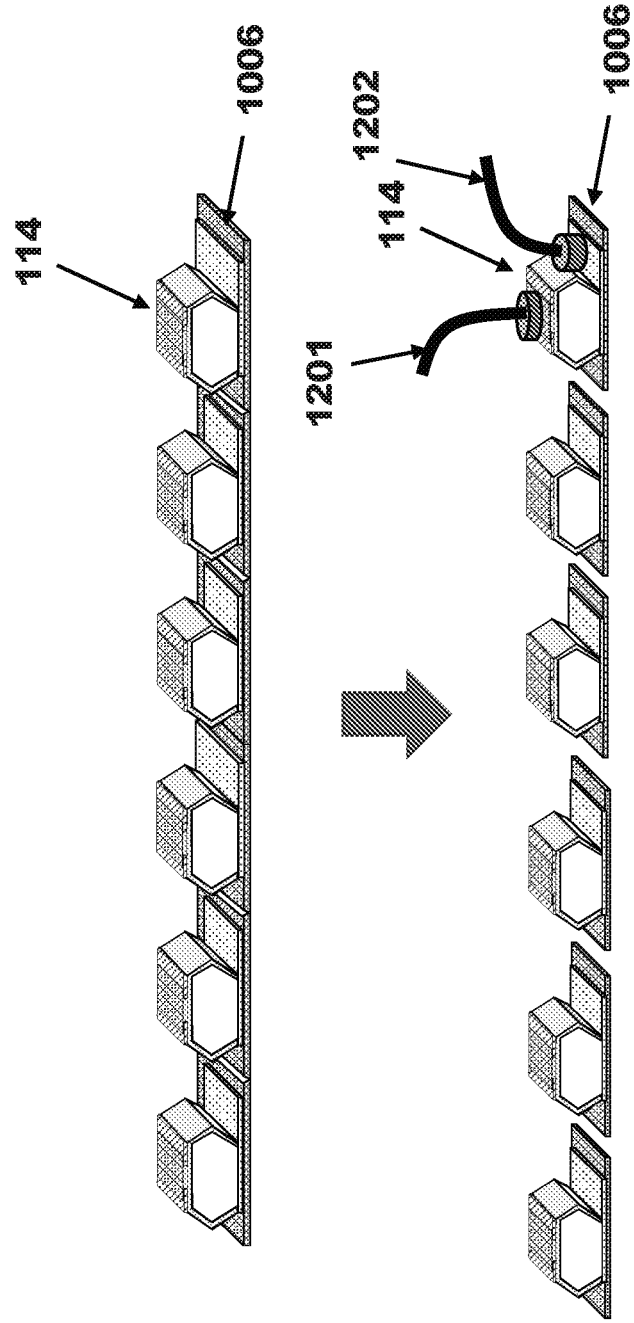

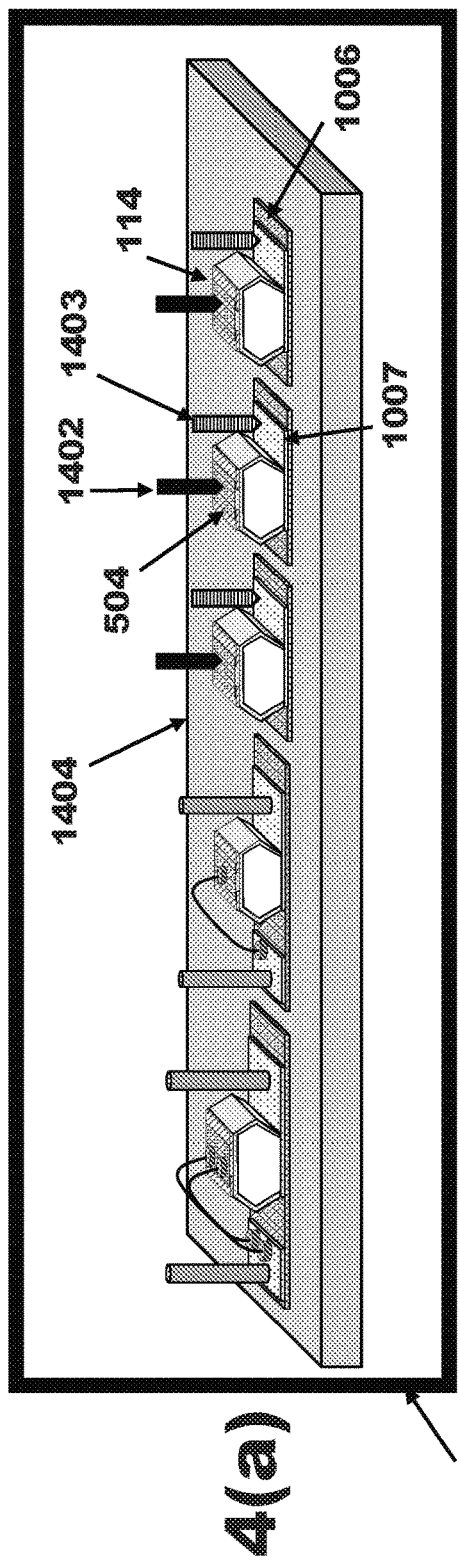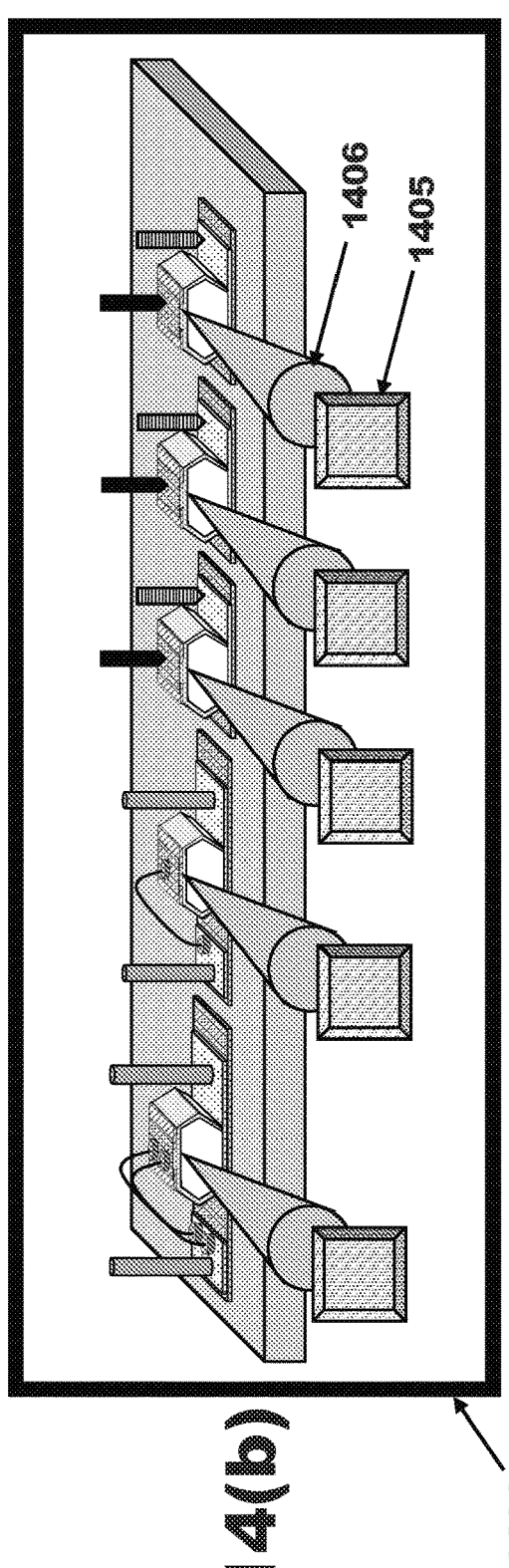
Fig. 14(a)
Fig. 14(b)

METHOD FOR REMOVAL OF DEVICES USING A TRENCH

CROSS REFERENCE TO RELATED APPLICATIONS

This application claims the benefit under 35 U.S.C. Section 119(e) of the following co-pending and commonly-assigned application:

U.S. Provisional Application Ser. No. 62/793,253, filed on Jan. 16, 2019, by Takeshi Kamikawa, Srinivas Gandrothula and Masahiro Araki, entitled "METHOD FOR REMOVAL OF DEVICES USING A TRENCH,";

which application is incorporated by reference herein.

This application is related to the following co-pending and commonly-assigned applications:

PCT International Patent Application No. PCT/US18/31393, filed on May 7, 2018, by Takeshi Kamikawa, Srinivas Gandrothula, Hongjian Li and Daniel A. Cohen, entitled "METHOD OF REMOVING A SUBSTRATE," which application claims the benefit under 35 U.S.C. Section 119(e) of co-pending and commonly-assigned U.S. Provisional Patent Application No. 62/502,205, filed on May 5, 2017, by Takeshi Kamikawa, Srinivas Gandrothula, Hongjian Li and Daniel A. Cohen, entitled "METHOD OF REMOVING A SUBSTRATE,";

PCT International Patent Application No. PCT/US18/51375, filed on Sep. 17, 2018, by Takeshi Kamikawa, Srinivas Gandrothula and Hongjian Li, entitled "METHOD OF REMOVING A SUBSTRATE WITH A CLEAVING TECHNIQUE," which application claims the benefit under 35 U.S.C. Section 119(e) of co-pending and commonly-assigned U.S. Provisional Patent Application No. 62/559,378, filed on Sep. 15, 2017, by Takeshi Kamikawa, Srinivas Gandrothula and Hongjian Li, entitled "METHOD OF REMOVING A SUBSTRATE WITH A CLEAVING TECHNIQUE,";

PCT International Patent Application No. PCT/US19/25187, filed on Apr. 1, 2019, by Takeshi Kamikawa, Srinivas Gandrothula and Hongjian Li, entitled "METHOD OF FABRICATING NONPOLAR AND SEMIPOLAR DEVICES USING EPITAXIAL LATERAL OVERGROWTH," which application claims the benefit under 35 U.S.C. Section 119(e) of co-pending and commonly-assigned U.S. Provisional Patent Application Ser. No. 62/650,487, filed on Mar. 30, 2018, by Takeshi Kamikawa, Srinivas Gandrothula, and Hongjian Li, entitled "METHOD OF FABRICATING NONPOLAR AND SEMIPOLAR DEVICES BY USING LATERAL OVERGROWTH,";

PCT International Patent Application No. PCT/US19/32936, filed on May 17, 2019, by Takeshi Kamikawa and Srinivas Gandrothula, entitled "METHOD FOR DIVIDING A BAR OF ONE OR MORE DEVICES," which application claims the benefit under 35 U.S.C. Section 119(e) of co-pending and commonly-assigned U.S. Provisional Application Ser. No. 62/672,913, filed on May 17, 2018, by Takeshi Kamikawa and Srinivas Gandrothula, entitled "METHOD FOR DIVIDING A BAR OF ONE OR MORE DEVICES,"; and PCT International Patent Application No. PCT/US19/34686, filed on May 30, 2019, by Srinivas Gandrothula and Takeshi Kamikawa, entitled "METHOD OF REMOVING SEMICONDUCTING LAYERS FROM A SEMICONDUCTING SUBSTRATE," which application claims the benefit under 35 U.S.C. Section 119(e) of co-pending and commonly-assigned U.S. Provisional Application Ser. No. 62/677,833, filed on May 30, 2018, by Srinivas Gandrothula and Takeshi Kamikawa, entitled "METHOD OF REMOVING SEMICONDUCTING LAYERS FROM A SEMICONDUCTING SUBSTRATE,";

PCT International Patent Application No. PCT/US19/59086, filed on Oct. 31, 2019, by Takeshi Kamikawa and Srinivas Gandrothula, entitled "METHOD OF OBTAINING A SMOOTH SURFACE WITH EPITAXIAL LATERAL OVERGROWTH," which application claims the benefit under 35 U.S.C. Section 119(e) of co-pending and commonly-assigned U.S. Provisional Application Ser. No. 62/753,225, filed on Oct. 31, 2018, by Takeshi Kamikawa and Srinivas Gandrothula, entitled "METHOD OF OBTAINING A SMOOTH SURFACE WITH EPITAXIAL LATERAL OVERGROWTH,";

all of which applications are incorporated by reference herein.

BACKGROUND OF THE INVENTION

1. Field of the Invention

This invention relates to a method for the removal of devices using a trench.

2. Description of the Related Art

Many device manufacturers have used free-standing bulk Gallium Nitride (GaN) substrates to produce laser diodes (LDs) and light-emitting diodes (LEDs) for lighting, optical storage, and other purposes. GaN substrates are attractive in that it is easy to obtain high-quality III-nitride based semiconductor layers having low defect densities by homoepitaxial growth on GaN substrates.

However, GaN substrates, which are typically produced using hydride vapor phase epitaxy (HVPE), are very expensive. Moreover, nonpolar and semipolar GaN substrates are more expensive than polar (c-plane) GaN substrates. As a result, researchers have investigated removing III-nitride based semiconductor layers from GaN substrates after the device is manufactured. Such a technique would result in a GaN substrate that can be recycled, which would provide a very cheap and high quality GaN substrate and III-nitride based devices for customers.

Consequently, there is a need for a technique that removes III-nitride based semiconductor layers from III-nitride based substrates or layers and hetero-substrates with the III-nitride-based layers in an easy manner.

In one previous technique, a GaN layer is spalled by a stressor layer of metal under tensile strain. See, e.g., Applied Physics Express 6 (2013) 112301 and U.S. Pat. No. 8,450,184, both of which are incorporated by reference herein. Specifically, this technique uses spalling in the middle of the GaN layer.

However, surface morphology on a spalling plane is rough and this technique cannot be controlled at the spalling position. Moreover, this removal method may damage the semiconductor layers due to excess bending in the layer that is being removed, which may result in cracks in unintended directions. Thus, it is necessary to reduce any such damage and surface roughness.

Another conventional technique is the use of photoelectrochemical (PEC) etching of sacrificial layers to remove device structures from GaN substrates, but this takes a long time and involves several complicated processes. Moreover, the yield from these processes have not reached industry expectations.

Thus, there is a need in the art for improved methods of removing III-nitride based substrates from III-nitride based semiconductor layers. The present invention satisfies this need.

SUMMARY OF THE INVENTION

To overcome the limitations in the prior art described above, and to overcome other limitations that will become apparent upon reading and understanding this specification, the present invention discloses a method for removing bars of devices from a substrate using a trench, and the resulting devices fabricated by the method.

Specifically, this invention performs the following steps: etching the substrate to form trenches at a surface of the substrate; depositing a growth restrict mask on the substrate, including on or in the trenches and optionally on at least part of remaining surface regions of the substrate, wherein the growth restrict mask has opening areas where the surface of the substrate is exposed; growing III-nitride ELO layers on the substrate using the growth restrict mask, wherein the III-nitride ELO layers have a depressed separate region formed by the trenches in the substrate, and the III-nitride ELO layers do not coalesce and remain separated from each other; optionally removing the growth restrict mask by wet or dry etching; growing III-nitride semiconductor device layers on the III-nitride ELO layers to create island-like III-nitride semiconductor layers on which opto-electronic devices, such as LEDs and LDs, are fabricated; removing bars of the devices from the substrate; and then dividing the bars into separate devices.

BRIEF DESCRIPTION OF THE DRAWINGS

Referring now to the drawings in which like reference numbers represent corresponding parts throughout:

FIGS. 2(a), 2(b), 2(c), 2(d), 2(e), 2(f), 2(g), 2(h), 2(i), 2(j) and 2(k) are schematics that illustrate the steps used in forming trenches in the substrate when fabricating the devices, in order to facilitate removal of the devices from the substrate using the trenches.

FIGS. 4(a), 4(b), 4(c), 4(d), 4(e), 4(f), 4(g) and 4(h) are schematics that illustrate how to prevent debris from forming between island-like III-nitride semiconductor layers.

FIGS. 5(a) and 5(b) are schematics that illustrate how to form a support structure for cleaving bars of devices.

FIGS. 6(a), 6(b), 6(c), 6(d) and 6(e) are schematics that illustrate how bars of devices are removed from the substrate.

FIGS. 7(a) and 7(c) are images of epitaxial lateral overgrowth layers, and FIG. 7(b) is a schematic view of an epitaxial lateral overgrowth layer.

FIGS. 13(a) and 13(b) are schematics that illustrate how a heat sink plate is divided in order to separate devices.

FIGS. 14(a) and 14(b) are schematics that illustrate how devices are screened.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Overview

The present invention discloses a method for the removal of one or more devices formed on a substrate using trenches. The devices may comprise light-emitting diodes (LEDs), laser diodes (LDs), Schottky barrier diodes (SBDs), or metal-oxide-semiconductor field-effect-transistors (MOSFETs).

Figure 1A:
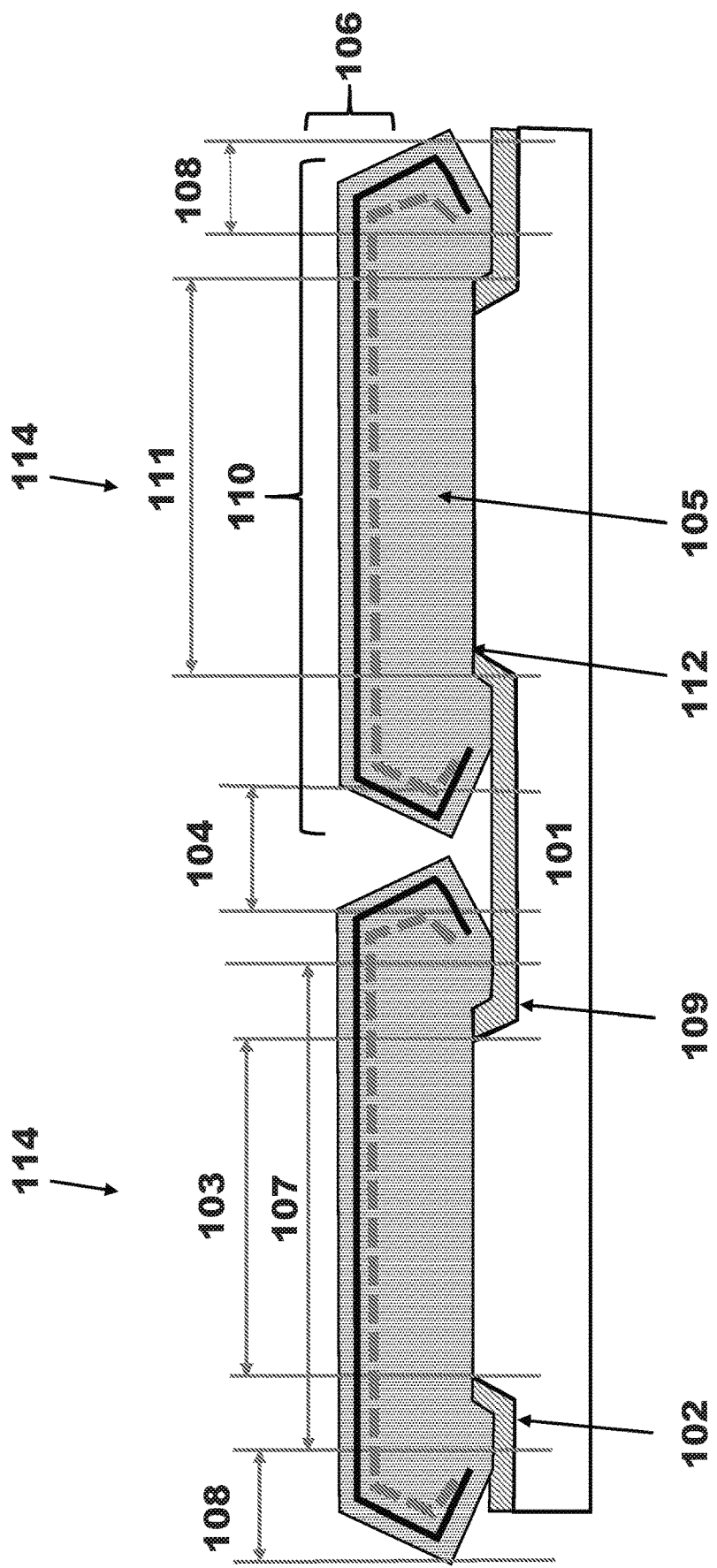
FIGS. 1(a) and 1(b) are schematics that illustrate the structures of devices according to the present invention.
Figure 1B:
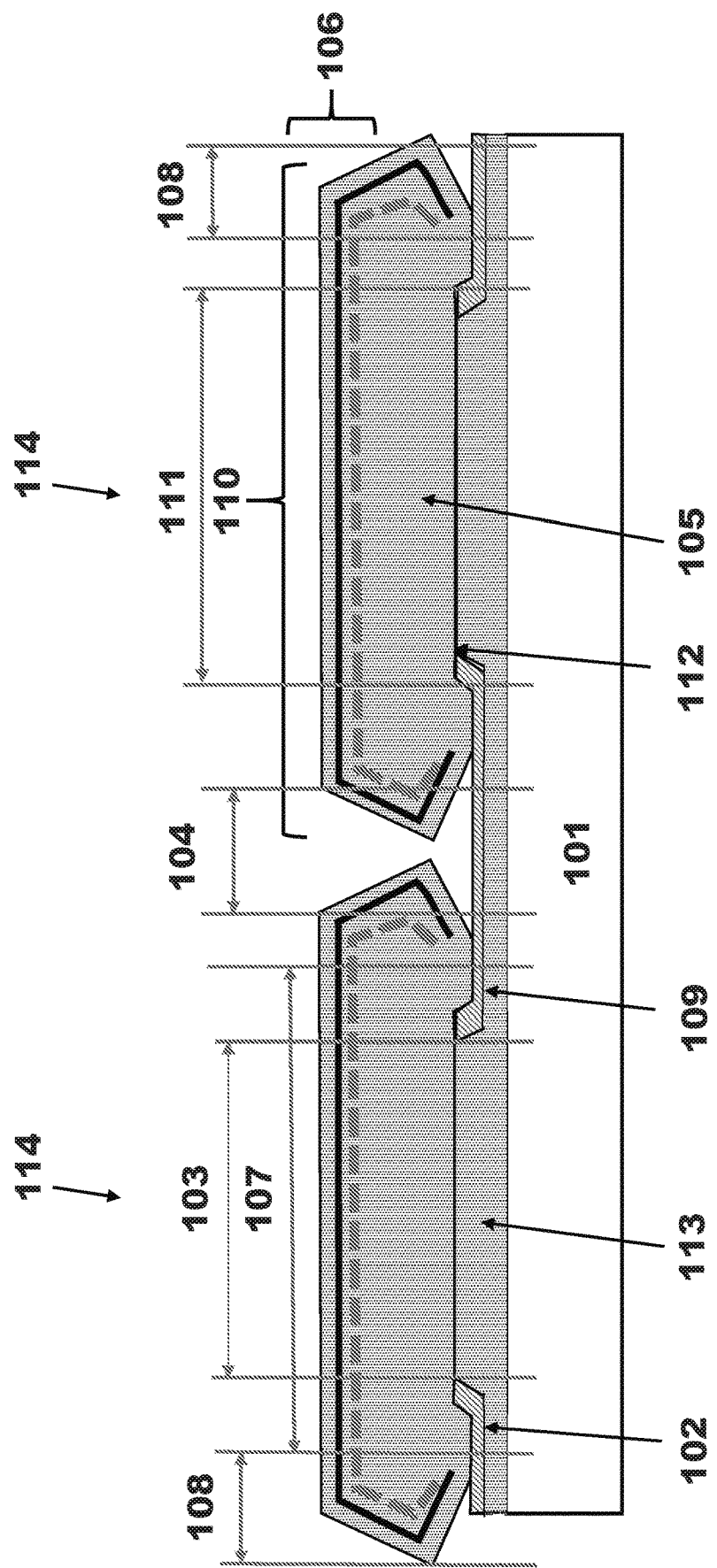

FIGS. 1(a) and 1(b) illustrate the structures fabricated according to the present invention, which include a substrate 101, growth restrict mask 102, opening areas 103, no-growth regions 104, III-nitride ELO layers 105, III-nitride semiconductor device layers 106, flat surface regions 107, layer bending regions 108, trenches 109, island-like III-nitride semiconductor layers 110, depressed separate regions 111, cleaving points 112 and III-nitride template layers 113, wherein the structures comprise one or more opto-electronic devices 114.

In alternative embodiments, a III-nitride substrate 101, such as GaN, etc., or a hetero-substrate 101, such as sapphire, Si, GaAs, SiC, etc., may be used. As shown in FIG. 1(b), a GaN template 113 or other III-nitride-based semiconductor layer 113 may be grown on the hetero-substrate 101, prior to the deposition or growth of other layers.

A plurality of trenches 109 are formed in the substrate 101, and the growth restrict mask 102 is deposited on or above the substrate 101, wherein the growth restrict mask 102 is deposited at least partly on or in the trenches 109.

The III-nitride ELO layers 105 are grown from the opening areas 103 of the growth restrict mask 102 without coalescing, leaving no-growth regions 104 between separate islands of the III-nitride ELO layers 105. The trenches 109 result in a symmetric shape for each island of the III-nitride ELO layers 105, wherein the symmetric shape results in devices 114 that are suitable for a flip-chip bonding.

The III-nitride semiconductor device layers 106, including the flat surface regions 107 and layer bending regions 108, are grown on the III-nitride ELO layers 105, resulting in island-like III-nitride semiconductor layers 110, which are used to form one or more devices 114. The width of the opening areas 103 is narrower than the width of the island-like III-nitride semiconductor layers 110. The island-like III-nitride semiconductor layers 110 bond to the substrate 101 generally only at the opening areas 103. The strength of the bonding between the growth restrict mask 102 and the island-like IIII-nitride semiconductor layers 110 is typically weak.

The trenches 109 result in depressed separate regions 111 on the bottom of the each island of the III-nitride ELO layers 105, wherein the surface of the depressed separate regions 111 is higher than the bottom of the III-nitride ELO layers 105. Cleaving points 112 are located higher than the bottom of the III-nitride ELO layers 105, and a force can be efficiently applied to the cleaving points 112 for removal of bars of the devices 114 formed by the island-like III-nitride semiconductor layers 110. Consequently, the trenches 109 help to remove the devices 114 from the substrate 101.

Forming Trenches in the Substrate

Following is a description of how the substrate 101 is processed in order to fabricate the devices 114 thereon, according to the present invention. Specifically, FIGS. 2(a)-2(k) illustrate the steps used in forming trenches 109 in the substrate 101 when fabricating the devices 114 in order to facilitate the removal of the devices 114 from the substrate 101 using the trenches 109.

Figure 2C:
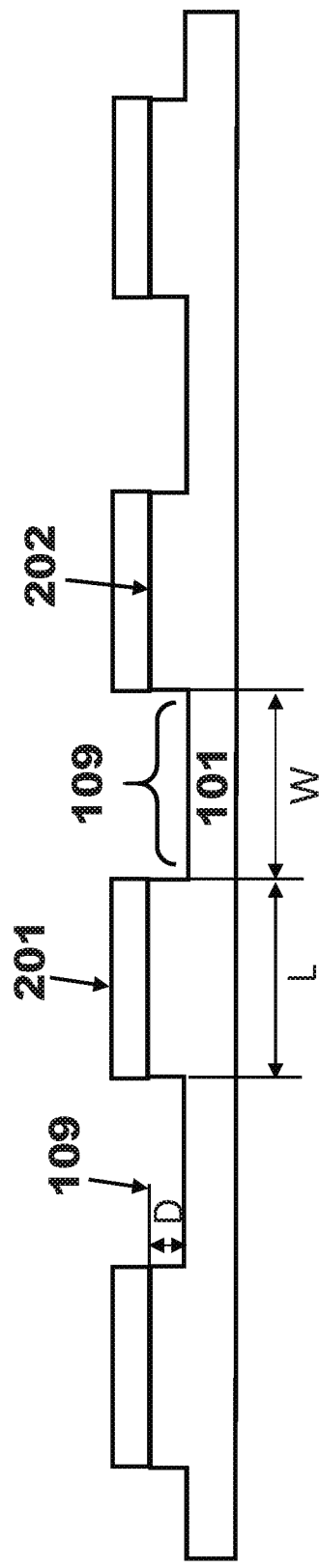
Figure 2D:
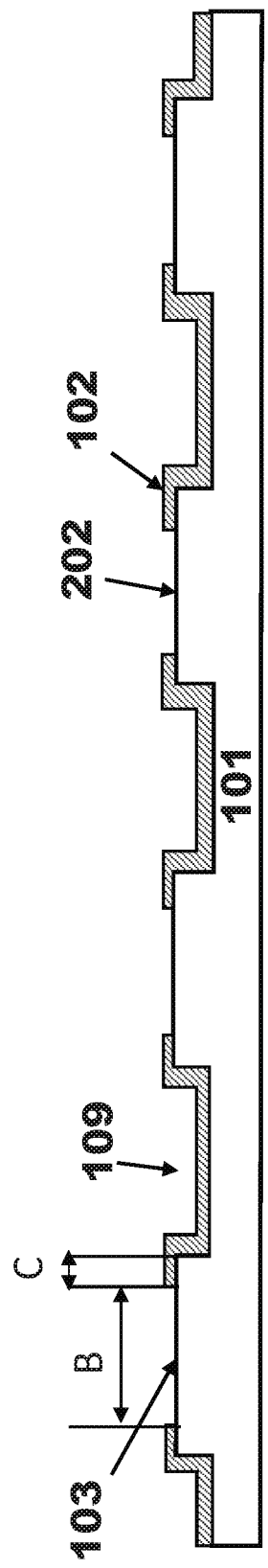
Figure 2I:
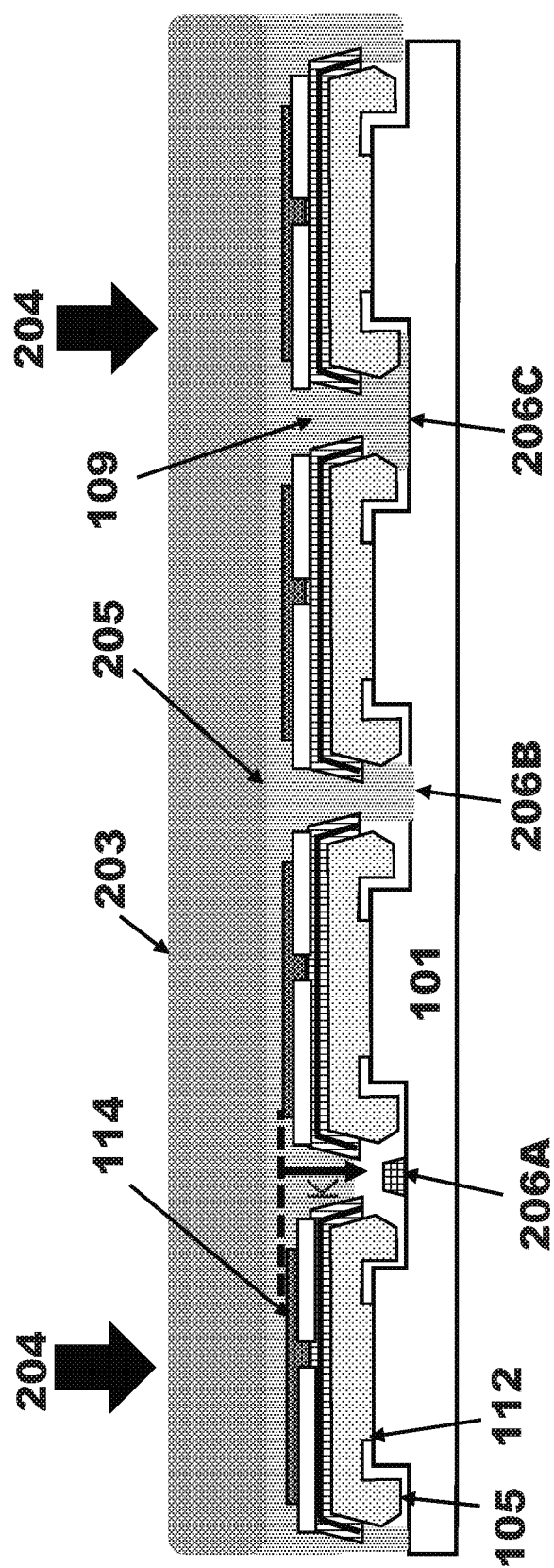
Figure 2K:
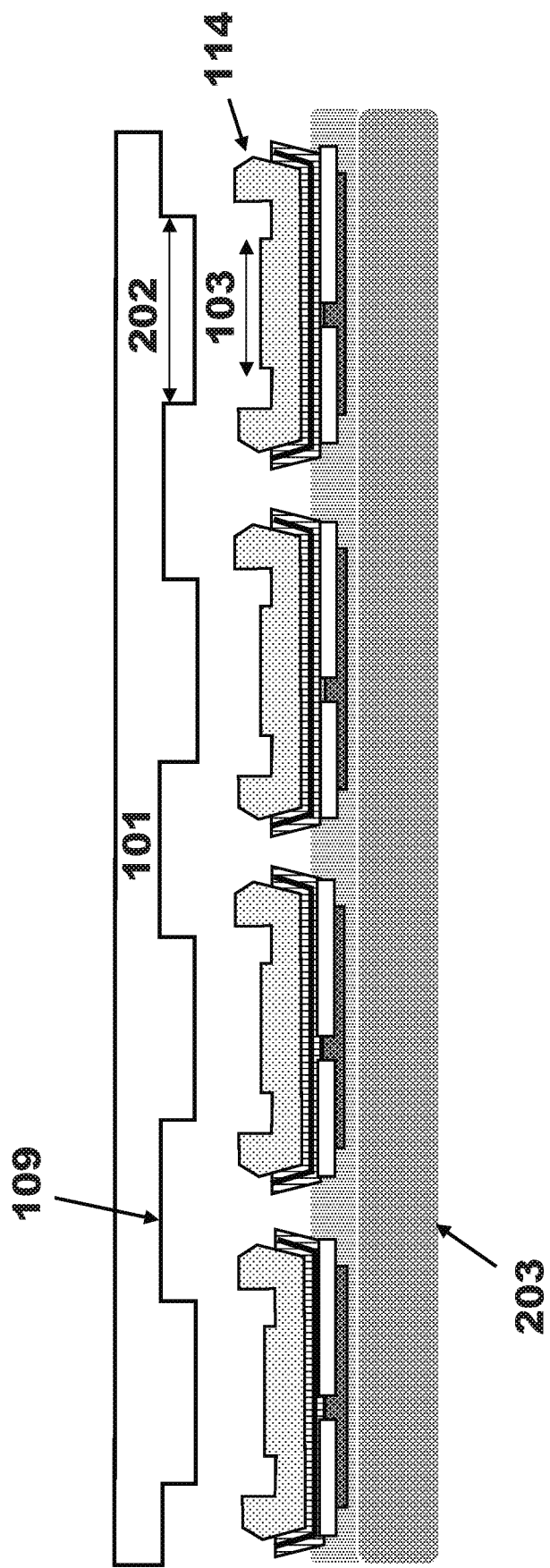

1. A substrate 101 is prepared, as shown in FIG. 2(a). In one embodiment, the substrate 101 is a freestanding m-plane GaN substrate 101 that has a mis-cut orientation with −1 degree towards the c-axis.
2. An SiO$_2$ mask 201 is deposited on the substrate 101 prior to forming the trenches 109 in the substrate 101, as shown in FIG. 2(b). Alternatively, a photo resist mask 201 may be used instead of an SiO$_2$ mask 201.
3. The trenches 109 are formed by wet or dry etching or another method, as shown in FIG. 2(c). In this embodiment, a width W of the trenches 109 is about 50 μm, and a depth D of the trenches 109 in the substrate 101 is about 1 μm. The mask 201, which covers remaining surface regions 202 of the substrate 101 having a width L of about 50 μm, is then removed.
4. The growth restrict mask 102 is formed on or in the trenches 109 and optionally on at least part of the remaining surface regions 202, as shown in FIG. 2(d). A width B of the opening areas 103 in the growth restrict mask 102 is about 50 μm, a width C of the growth restrict mask 102 covering the remaining surface regions 202 is about 5 μm, and the thickness of the growth restrict mask 102 is about 0.2 μm.
5. The III-nitride ELO layers 105 are grown on the substrate 101 with trenches 109, as shown in FIG. 2(e). By doing this, the III-nitride ELO layers 105 have depressed separate regions 111.
6. After the growth of the III-nitride ELO layers 105, the substrate 101 may be removed from the MOCVD reactor, and the growth restrict mask 102 may be removed by wet or dry etching or another method, also as shown in FIG. 2(e).
7. The III-nitride semiconductor device layers 106 are grown by metalorganic chemical vapor deposition (MOCVD) on the III-nitride ELO layers 105, resulting in island-like III-nitride semiconductor layers 110, as shown in FIG. 2(f). At the same time, the III-nitride semiconductor layers 106 may also be grown on the trenches 109 in the substrate 101.
8. Device processing is performed on the island-like III-nitride semiconductor layers 110, resulting in devices 114, as shown in FIG. 2(g). This processing may include, inter alia, the forming of ridge stripe structures, the deposition of p-electrodes, etc.
9. A polymer film 203 is attached to a top surface of the devices 114, as shown in FIG. 2(h). The polymer film 203 may be a multi-layer film 203.
10. Pressure 204 is applied to the polymer film 203, which pushes a bottom part 205 of the polymer film 203 into the trenches 109, as shown in FIG. 2(i). The bottom part 205 of the polymer film 203 may be located at a distance K below a top surface of the devices 114, as represented by 206A in FIG. 2(i). Alternatively, the bottom part 205 of the polymer film 203 may contact the bottom of the trenches 109, as represented by 206B and 206C in FIG. 2(i).
11. The cleaving points 112 are located higher than a bottom portion of the III-nitride ELO layers 105 of the device 114, which means that force 207 can be efficiently applied to the polymer film 203, and thus the cleaving points 112, to remove the devices 114 from the substrate 101 using the polymer film 203, as shown in FIGS. 2(i) and 2(j).
12. As shown in FIG. 2(k), which depicts the devices 114 and polymer film 203 flipped, the width of the remaining surface regions 202 of the substrate 101 is greater than the width of the opening areas 103, with the difference being the width of the growth restrict mask 102 on the remaining surface regions 202.
13. Once the devices 114 are removed from the substrate 101, but still attached to the polymer film 203, further processing can be performed, as described in more detail below. This further processing may include forming a support structure for cleaving at side facets and the flat surface regions 107 of the devices 114, fabricating n-electrodes on the devices 114, breaking bars of the devices 114 into separate devices 114, coating facets of laser diode devices 114, screening the devices 114 and mounting the devices 114 on or into packages.

Device Fabrication Process

A more detailed description of the steps used by the present invention in fabricating the devices 114 is provided below.

Step 1: Forming trenches 109 on the substrate 101, wherein the substrate 101 is a III-nitride substrate 101 or a hetero-substrate 101 with a III-nitride template 113 deposited thereon.

Step 2: Depositing the growth restrict mask 102 on the substrate 101 including at least partially on or in the trenches 109, with remaining surface regions 202 of the substrate 101 exposed by striped opening areas 103 in the growth restrict mask 102.

Step 3: Growing the III-nitride ELO layers 105 on or above the substrate 101 in an MOCVD reactor using the growth restrict mask 102, such that growth of the III-nitride ELO layers 105 extends in a direction parallel to the striped opening areas 103 of the growth restrict mask 102, and the III-nitride ELO layers 105 do not coalesce.

Step 4: Removing the substrate 101 with the III-nitride ELO layers 105 from the MOCVD reactor, wherein the growth restrict mask 102 is removed by dry or wet etching with an etchant such as hydrofluoric (HF) or buffered HF (BHF) acid.

Step 5: Growing III-nitride semiconductor device layers 106 on the III-nitride ELO layers 105 and on a surface of the substrate 101 between islands of the III-nitride ELO layers 105.

Step 6: Fabricating one or more devices 114 at the flat surface regions 107 by conventional methods, wherein ridge stripe structures, p-electrodes, etc., are disposed on each of the island-like III-nitride semiconductor layers 110 at pre-determined positions.

Step 7: Forming a support structure for cleaving at side facets and the flat surface regions 107 of the devices 114.

Step 8: Removing bars of the devices 114 from the substrate 101 by:
  Step 8.1: Attaching the polymer film 203 to the bars.
  Step 8.2: Applying pressure 204 to the polymer film 203 and the substrate 101.
  Step 8.3: Reducing the temperature of the polymer film 203 and the substrate 101 while the pressure is applied.
  Step 8.4: Utilizing the different of thermal coefficient between the polymer film 203 and the substrate 101 for removing the bars.

Step 9: Fabricating n-electrodes on the bars.
Step 10: Breaking the bars into separate devices 114.
Step 11: Mounting the devices 114 on a heat sink plate.
Step 12: Coating the facets of each laser diode device 114.
Step 13: Dividing the heat sink plate and the devices 114.
Step 14: Screening the devices 114.
Step 15: Mounting the devices 114 on or into the packages.

These steps are explained in more detail below.

Step 1: Forming Trenches on the Substrate

The trenches 109 in the substrate 101 may be formed by dry etching, wet etching or other methods. In one embodiment, as shown in FIGS. 3(a)-3(b), a width W of each trench 109 is about 50 μm, a depth D of each trench 109 is about 1 μm, a width L of each remaining surface region 202 of the substrate 101 between trenches 109 is about 50 μm, and a width C of an overlap region of the growth restrict mask 102 on the remaining surface region 202 is about 5 μm. In this case, the shape of the opening areas 103, the trench 109, and the remaining surface regions 202 is a stripe, as shown in FIG. 3(b).

Step 2: Depositing the Growth Restrict Mask on the Substrate Including at Least Partially on or in the Trenches The substrate 101 is patterned with an $SiO_2$ layer, wherein the patterned $SiO_2$ layer is the growth restrict mask 102. The growth restrict mask 102 shown in FIGS. 3(a) and 3(b) comprises a plurality of opening areas 103, which are arranged in a first direction parallel to the 11-20 direction of the (1-100) plane-oriented III-nitride-based semiconductor substrate 101 and a second direction parallel to the 0001 direction of the III-nitride-based semiconductor substrate 101, periodically at intervals p, extending in the second direction. The growth restrict mask 102 may or may not partly cover the remaining surface region 202.

In one embodiment, a length A of the opening area 103 is about 200-35000 μm, a width B of the opening area 103 is about 2-180 μm, and the growth restrict mask 102 has a thickness of about 0.05-3 μm. In addition, an interval P between the opening areas 103 is about 100-1000 μm.

Step 3: Growing the III-Nitride ELO Layers on the Substrate Using the Growth Restrict Mask Epitaxial GaN layers 105 are grown by ELO on the substrate 101 using the growth restrict mask 102. By doing this, the III-nitride ELO layers 105 are grown only on the opening areas 103, which are formed on the remaining surface regions 202 of the substrate 101. Also, the III-nitride ELO layers 105 do not coalesce on top of the growth restrict mask 102.

In one embodiment, MOCVD is used for the epitaxial growth of the III-nitride ELO layers 105. Trimethylgallium (TMGa) is used as III elements source. Ammonia ($NH_3$) is used as the raw gas to supply Nitrogen. Hydrogen ($H_2$) and nitrogen ($N_2$) are used as a carrier gas of the III elements sources. It is important to include hydrogen in the carrier gas to obtain a smooth surface epi-layer. In one embodiment, the thickness of the III-nitride ELO layers 105 is about 3-100 μm. Moreover, the III-nitride ELO layers 105 may comprise GaN or AlGaN layers in order to obtain a smooth surface.

Step 4: Removing the Growth Restrict Mask

After the III-nitride ELO layers 105 are grown, the substrate 101 may be removed from the MOCVD reactor, in order to remove the growth restrict mask 102 by wet etching, dry etching, or other methods. This is an optional step that increases a growth area on the substrate 101.

Removing the growth restrict mask 102 before the growth of the III-nitride semiconductor device layers 106 also reduces excess supply gases to side facets of the III-nitride ELO layers 105. Reducing the excess supply gases to the side facets can avoid edge growth at an edge region of the III-nitride ELO layers 105. This can make it easier to obtain a smooth surface and a uniform emission from an active layer in the III-nitride semiconductor device layers 106.

However, if the growth restrict mask 102 is not removed before the growth of the III-nitride semiconductor device layers 106, there can be other benefits. As shown in FIGS. 4(a)-4(e), debris 401 is often deposited on the growth restrict mask 102 during growth of thick In-containing AlGaN and InGaN layers within the III-nitride semiconductor device layers 106. In some situations, two of the island-like III-nitride semiconductor layers 110 may be connected by the debris 401. Afterward, this debris 401 can be removed by ultra-sonic cleaning, wet etching, or another method. However, sometimes this leads to reduced yields in a mass production environment.

As shown in FIGS. 4(a)-4(h), the growth restrict mask 102 may be deposited on or in the trench 109. The amount of supply gases is low at an edge of the trench 109, which reduces the amount of debris 401. Eventually, this effect avoids the connection of the debris 401 and the island-like III-nitride semiconductor layers 110.

Figure 4C:
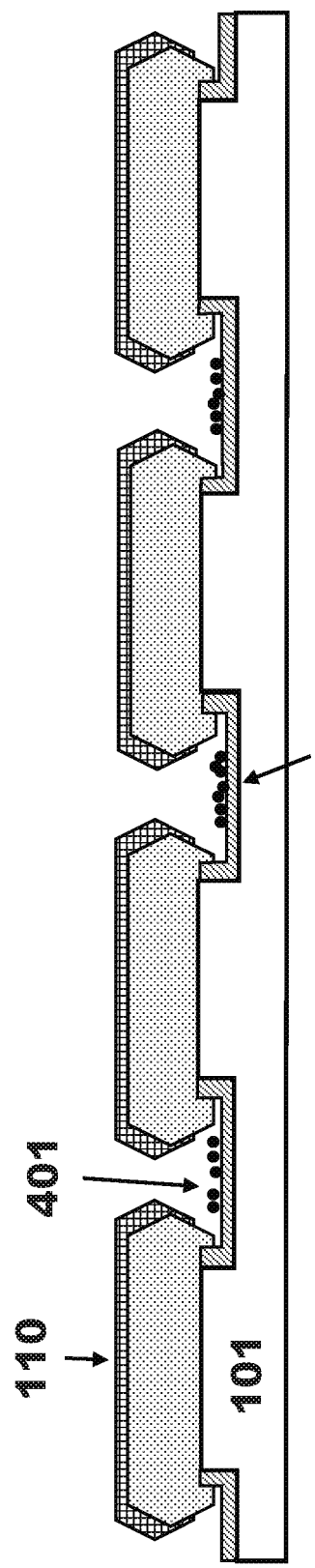
Figure 4D:
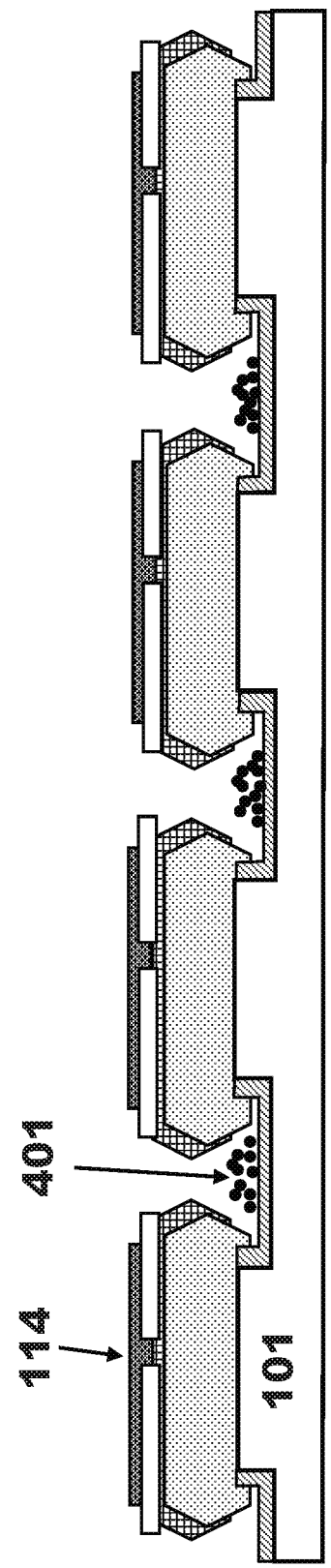
Figure 4E:
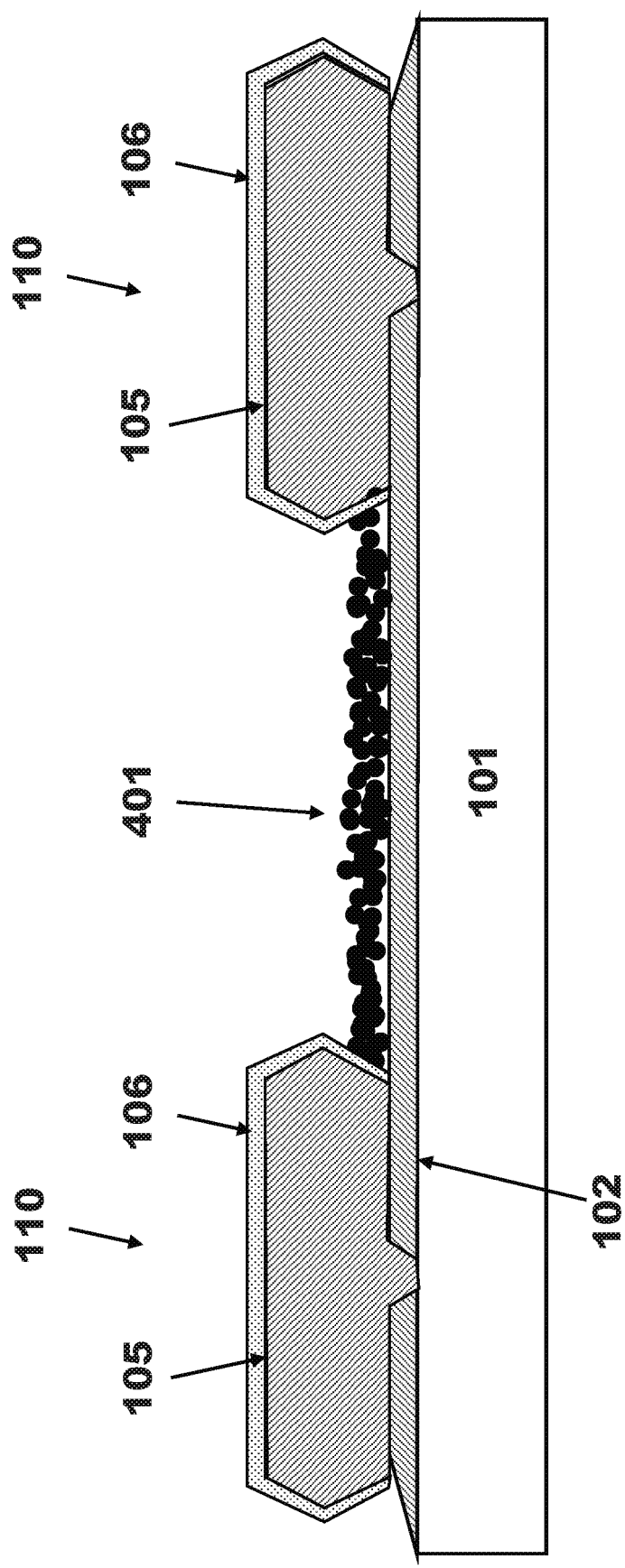
Figure 4F:
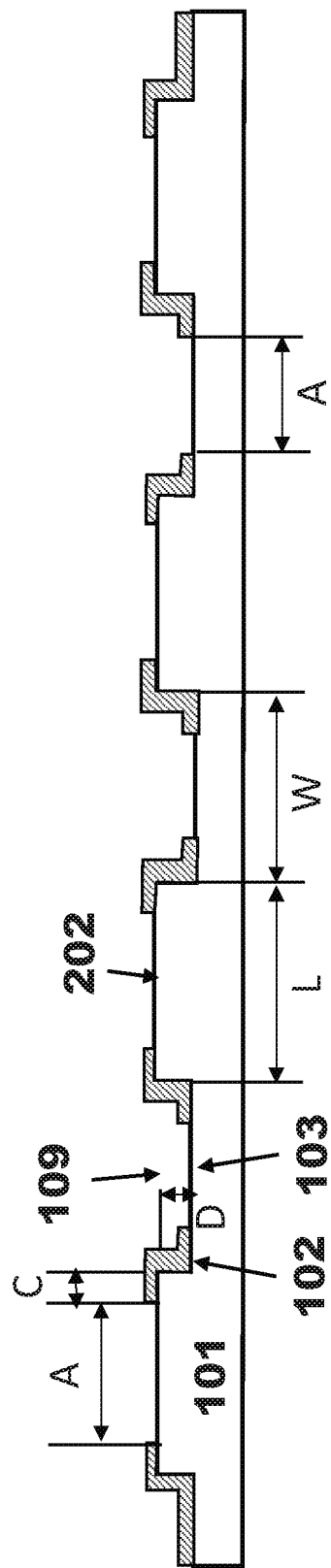
Figure 4G:
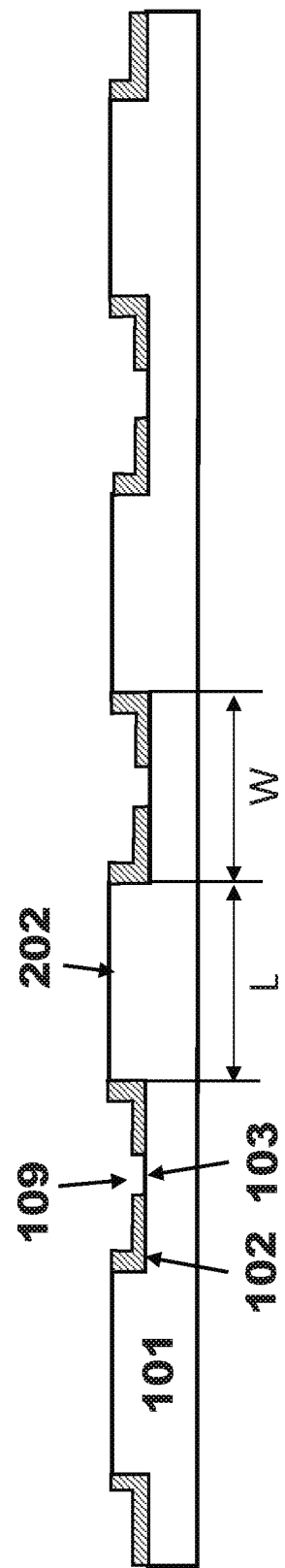
Figure 4H:
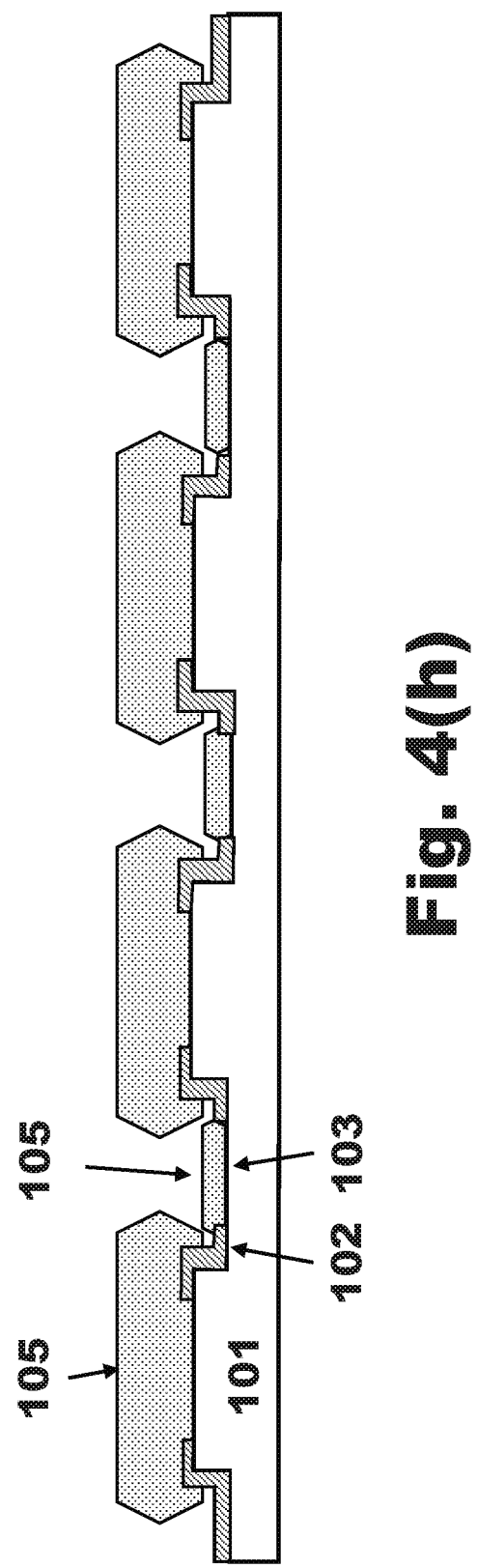

There are some different types of the mask 102 shapes, as shown in FIGS. 4(a)-4(d), 4(e) and 4(f)-4(h). In FIGS. 4(f)-4(h), the growth restrict mask 102 in the trenches 109 have one or more opening areas 103 near the center of the trenches 109. In FIG. 4(h), the III-nitride ELO layers 105 are grown at the opening areas 103 in the trenches 109.

There is another difference between FIG. 4(f) and FIG. 4(g), wherein FIG. 4(f) shows the growth restrict mask 102 on the remaining surface regions 202 and FIG. 4(g) does not. In FIG. 4(f), there are the growth restrict masks 102 on edges of the remaining surface regions 202, while FIG. 4(g) shows the growth restrict mask 102 only within the trenches 109. The existence of the growth restrict mask 102 on the remaining surface regions 202 is important in determining where the cleaving should start, which is helps raise yields in a mass-production environment. However, as shown in FIG. 4(g), even without the growth restrict mask 102 on the remaining surface regions 202, it is easy to remove the bar of the device.

Step 5: Growing III-Nitride Semiconductor Device Layers

The substrate 101 is loaded into the MOCVD reactor for the growth of the III-nitride semiconductor device layers 106, resulting in the island-like III-nitride semiconductor layers 110. Trimethylgallium (TMGa), trimethylindium (TMIn) and triethylaluminium (TMAl) are used as III elements sources. Ammonia ($NH_3$) is used as the raw gas to supply Nitrogen. Hydrogen ($H_2$) and nitrogen ($N_2$) are used as a carrier gas of the III elements sources. It is important to include hydrogen in the carrier gas to obtain a smooth surface epi-layer.

Saline and Bis(cyclopentadienyl)magnesium ($Cp_2Mg$) is used as n-type and p-type dopants. The pressure setting typically is 50 to 760 Torr. The III-nitride-based semiconductor layers are generally grown at temperature ranges from 700 to 1250° C.

For example, the growth parameters include the following: TMG is 12 sccm, $NH_3$ is 8 slm, carrier gas is 3 slm, $SiH_4$ is 1.0 sccm, and the VIII ratio is about 7700. These growth conditions are only one example, and can be changed and optimized for each of above described layers.

Step 6: Fabricating the Devices on the Flat Surface Regions

The devices 114 are fabricated on the flat surface regions 107, and may include ridge stripe structures, p-electrodes, etc. Conventional methods can be used to fabricate the ridge stripe structures, p-electrodes, etc.

Figure 5B:
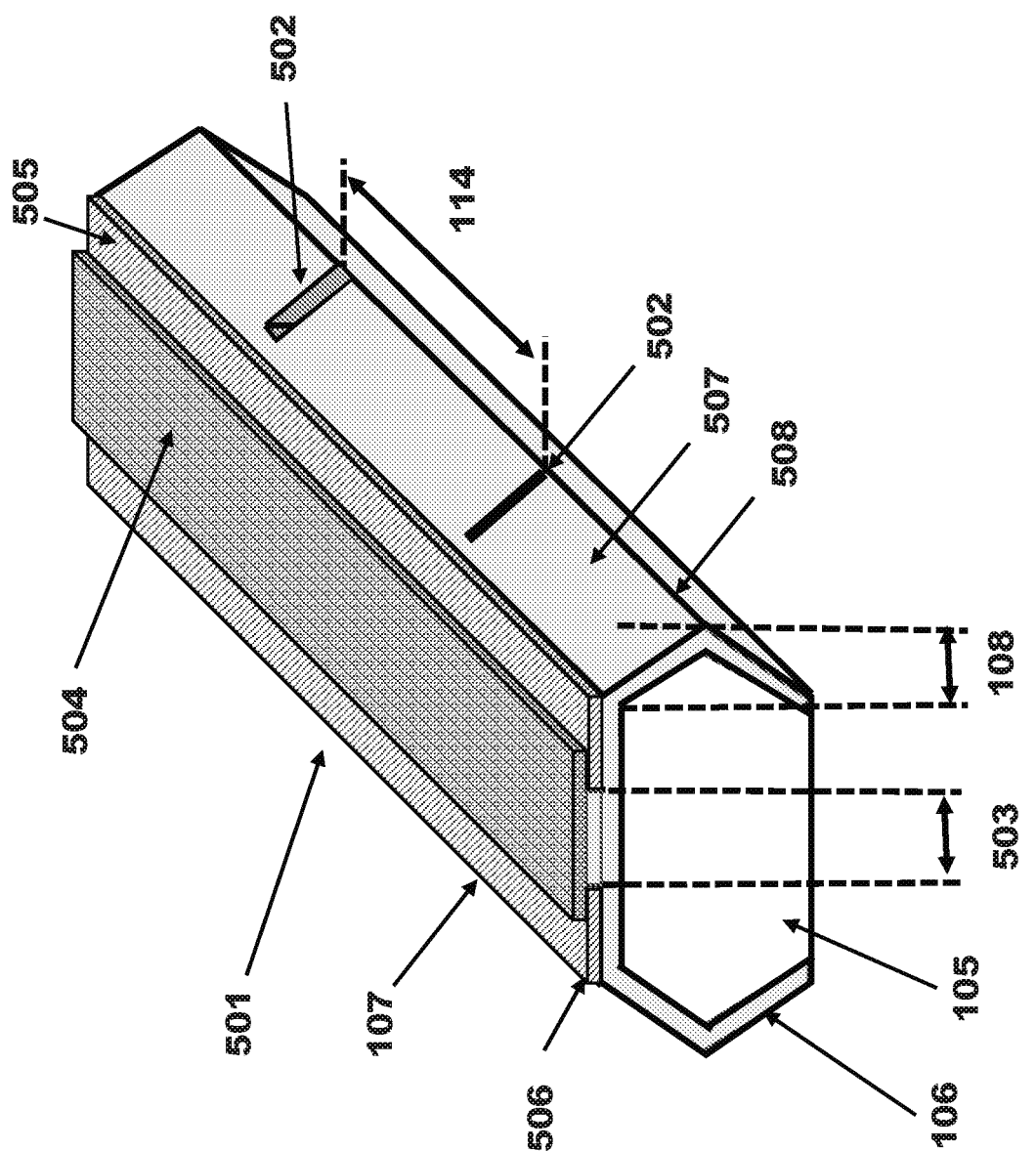

Step 7: Forming a Support Structure for Cleaving at Side Facets and the Flat Surface Regions As shown in FIGS. 5(a) and 5(b), the aim of this step is to prepare to divide a bar 501 of the device 114 before the bar 501 of the device 114 is removed from the substrate 101. A dividing support region 502 is formed at periodic lengths, wherein each period is determined by the device 114 length. For example, in the case of a laser diode device 114, one period is set to be 300-1200 μm.

The dividing support region 502 is a line scribed by a diamond tipped scriber or laser scriber, as shown in FIG. 5(a); or a trench formed by dry-etching such as RIE (Reactive Ion Etching) or ICP (Inductively Coupled Plasma), as shown in FIG. 5(b); but is not limited to those methods. The dividing support region 502 may be formed on both sides of the bar 501 or on one side of the bar 501. The depth of the dividing support region 502 is preferably 1 μm or more.

Both cases can divide the bar 501 into separate devices 114 at the dividing support region 502, because the dividing support region 502 is weaker than any other part. The dividing support region 502 avoids breaking the bar 501 at unintentional positions, so that it can precisely determine the device 114 length.

The dividing support region 502 is created at the flat surface region 107 in a manner that avoids a current injection region 503, which is in the ridge stripe structure, and the p-electrode 504, and the layer bending region 108, although it may encompass at least a portion of an $SiO_2$ current limiting layer 505.

The dividing support region 502 is formed at a first facet 506, and optionally, a second facet 507, which are easy to process because they are flattened areas. A third facet 508 may be avoided.

As shown in FIG. 5(b), it may be preferable that the dividing support region 502 is formed only at the second facet 506, in which case, it must use the small width of the island-like III-nitride-based semiconductor layers 110. In this case, it can divide the bar 501 of the device 114 precisely.

Moreover, the p-electrode 504, dielectric layer 505, and p-pad for wire bonding and so on, can avoid the dividing support region 502.

By doing this, the shape of the dividing support region 502 is formed uniformly. It is much preferable that a blade for breaking the bar 501 contact the back-side of the bar 501. By doing this, the cleaving starts from the dividing support region 502 at the top surface of the bar 501, but is not limited to this technique.

Step 8: Removing Bars of the Devices From the Substrate

FIGS. 6(a)-6(e) describe how bars of the devices 114 are removed from the substrate 101.

Figure 6A:
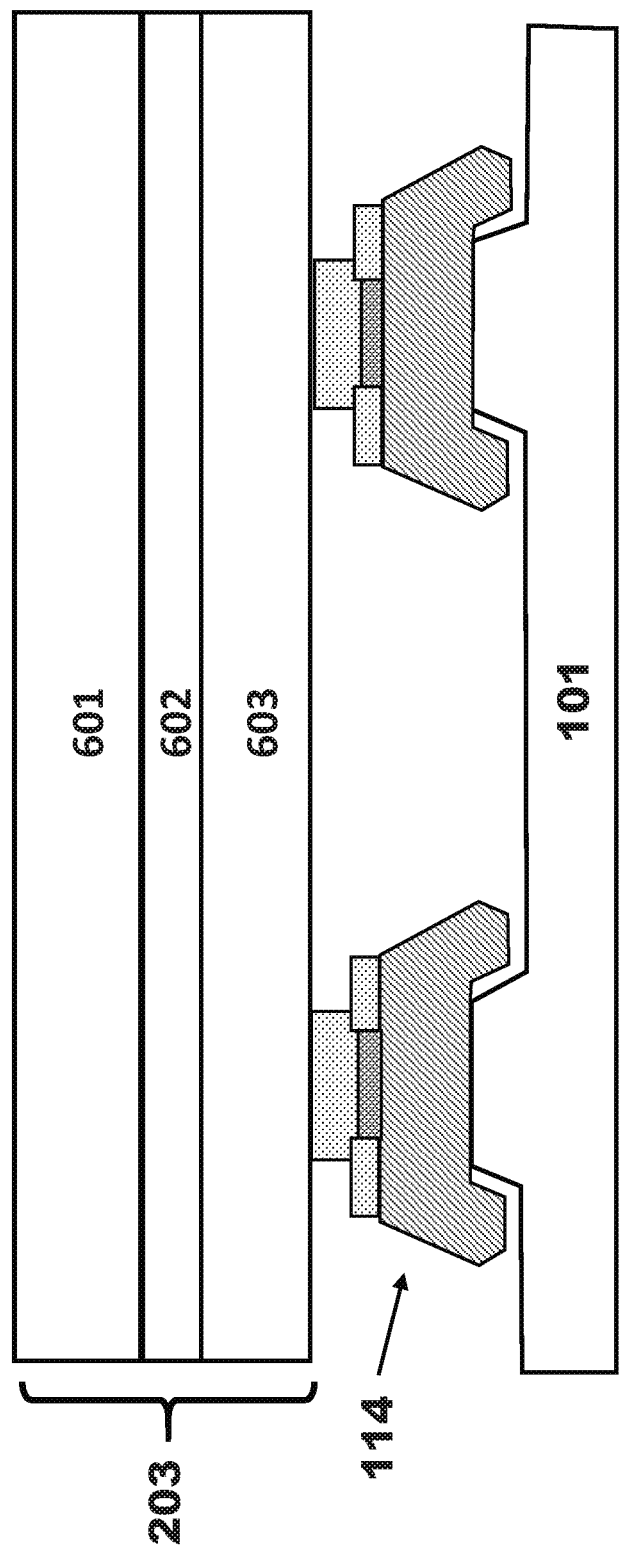

Step 8.1 comprises attaching the polymer film 203 to a top surface of the devices 114, as shown in FIG. 6(a). In one embodiment, the polymer film 203 is comprised of a base film 601, an adhesive layer 602, and a backing film 603. However, more or fewer layers may be used as well.

Figure 6B:
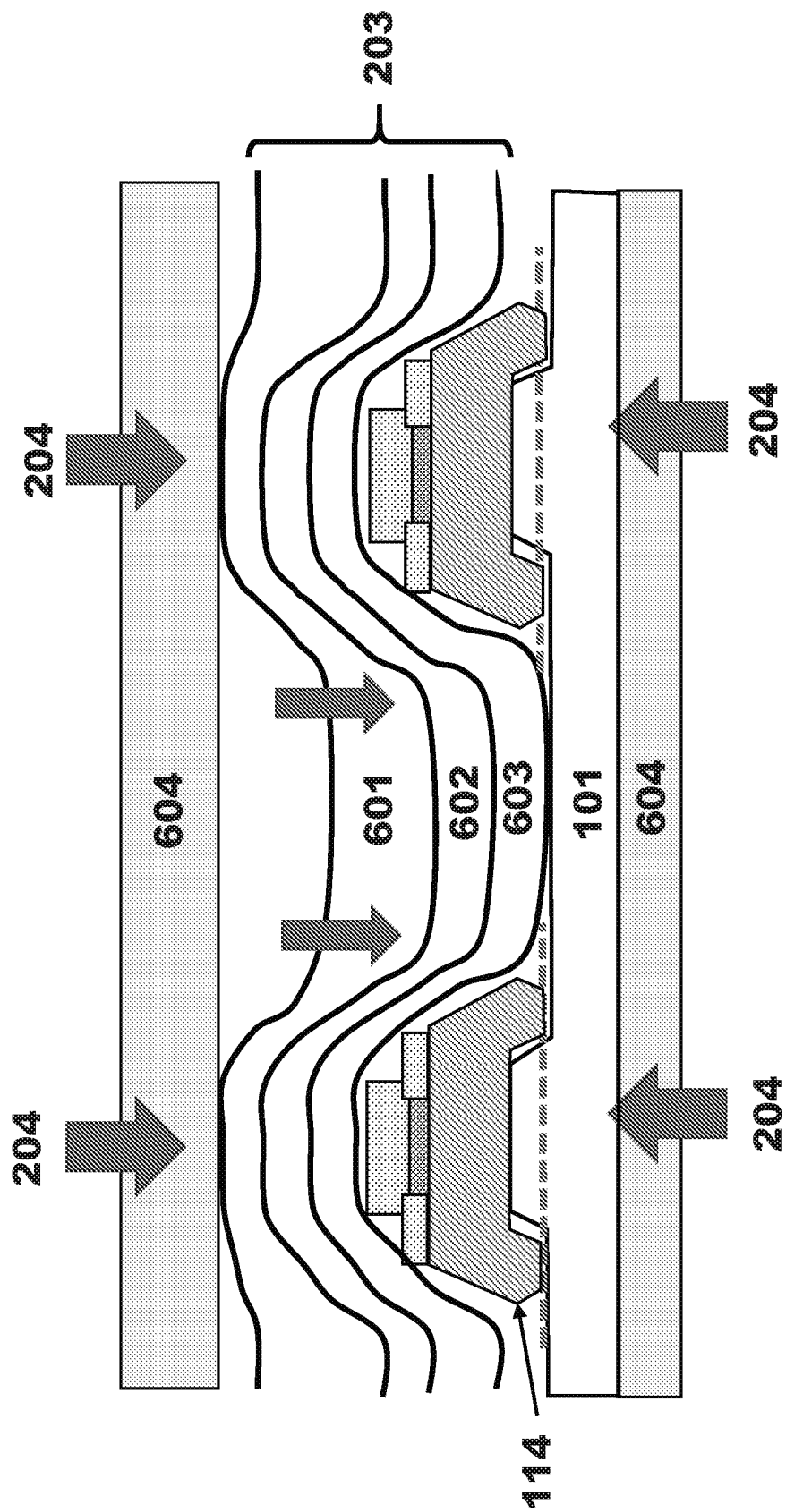

Step 8.2 comprises applying pressure 204 to the polymer film 203, devices 114 and the substrate 101 using plates 604 or other means, as shown in FIG. 6(b). The aim of applying pressure 204 is to place the polymer film 203 in-between the devices 114. The polymer film 203 is softer than the devices 114, so the polymer film 203 can easily surround the devices 114. Preferably, the polymer film 203 is heated in order to soften it, which makes it easy for the polymer film 203 to cover the devices 114.

Figure 6C:
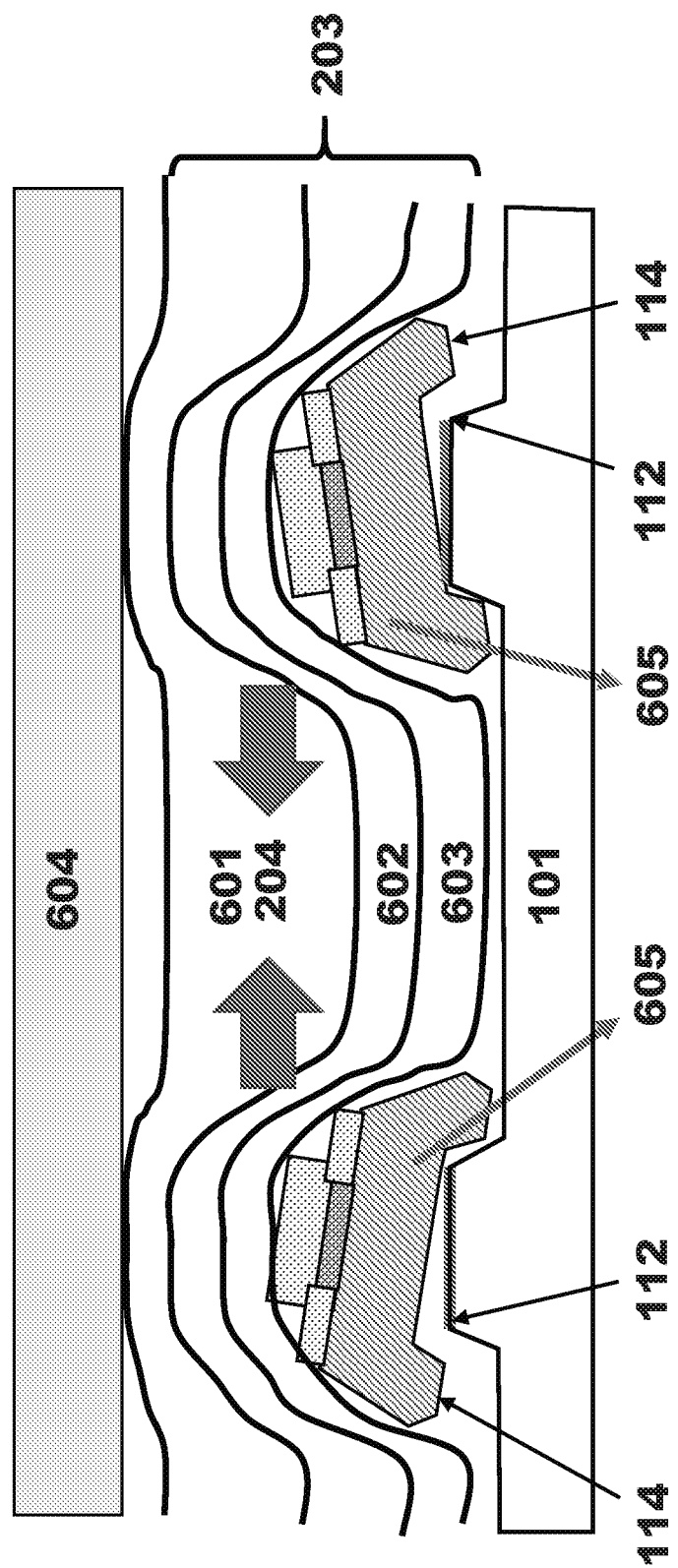

If the III-nitride ELO layers 105 are very thin, such as under 10 μm, it is not easy to wrap the III-nitride ELO layers 105. However, in the present invention, the trenches 109 formed in the substrate 101 help the polymer film 203 wrap the III-nitride ELO layers 105. Because the polymer film 203 is pushed down to the cleaving point 112, and pressure 204 is applied horizontally, the devices 114 are tilted obliquely downward 605, and it is easier to remove the devices 114 from the substrate 101, as shown in FIG. 6(c).

Without the trench 109, the shape of the III-nitride ELO layers 105 is shown in FIG. 7(a), wherein the cleaving point 112 and the bottom of the III-nitride ELO layers 105 are same height. With the trench 109, the shape of the III-nitride ELO layers 105 is shown in FIGS. 7(b) and 7(c), wherein the cleaving point 112 is above the bottom of the III-nitride ELO layers 105.

Figure 6D:
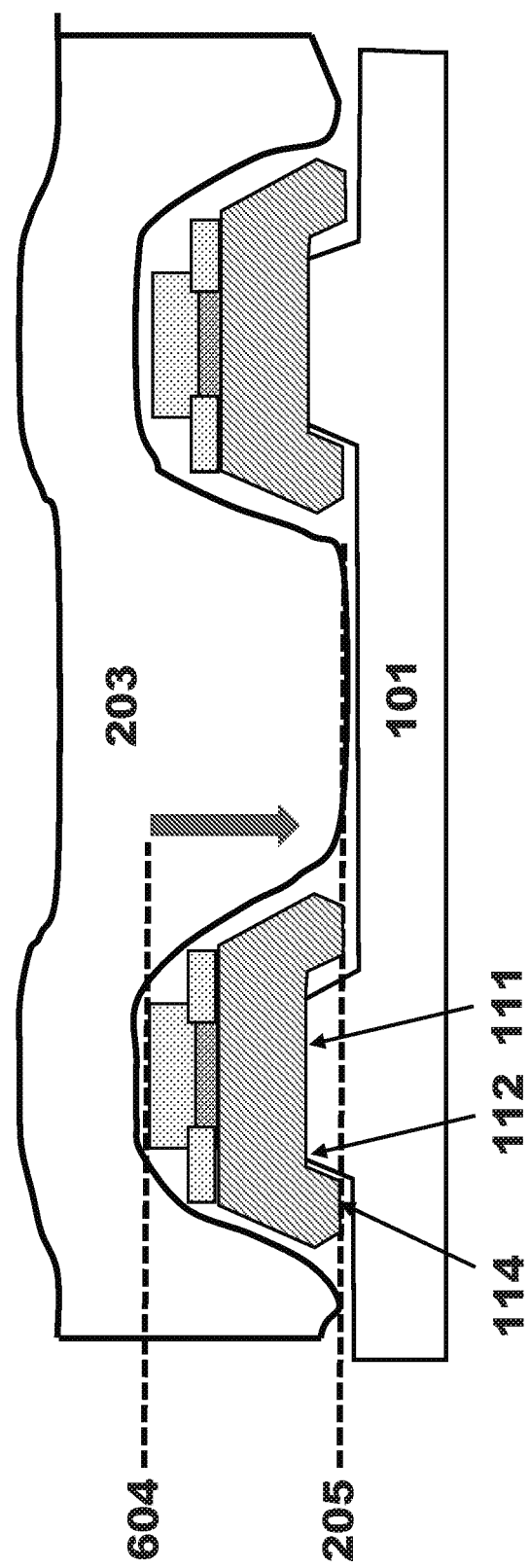

In the present invention, the most important things to facilitate to remove the bar 501, the bottom of the III-nitride ELO layers 105 are below the cleaving point 112, as shown in FIG. 6(d). The difference in height between the bottom of the III-nitride ELO layers 105 and the cleaving point 112 is more than zero.

In this case, the force from the polymer film 203 is efficiently applied to the cleaving point 112. In other words, the III-nitride ELO layers 105 have a depressed separate region 111, and the surface of the depressed separate region 111 is located higher than the bottom of the III-nitride ELO layers 105. The result is that the trenches 109 allow thinner and wider III-nitride ELO layers 105 to be easily removed.

Step 8.3 comprises reducing the temperature of the film 203 and the substrate 101 while maintaining the applied pressure 204. However, it is not necessary to apply pressure 204 during the changing of the temperature.

Various methods may be used to reduce the temperature. For example, the substrate 101 and the polymer film 203 can be placed into liquid $N_2$ (for example, at 77° K) at the same time as applying pressure 204. The temperature of the substrate 101 and polymer film 203 can also be controlled with a piezoelectric transducer. Moreover, the plate 604 that applies pressure 204 to the polymer film 203 can be cooled to a low temperature before and/or during contact with the polymer film 203. By doing this, the polymer film 203 is cooled and can apply pressure 204 to the devices 114 due to a large thermal expansion coefficient.

When reducing the temperature, the substrate 101 and polymer film 203 may be wetted by atmospheric moisture. In this case, the temperature reduction can be conducted in a dry air atmosphere or a dry $N_2$ atmosphere, which avoids the substrate 101 and the polymer film 203 from getting wet.

Step 8.4 comprises utilizing the differences in thermal coefficients between the polymer film 203 and the substrate 101 for removing the devices 114 from the substrate 101.

As shown in FIG. 6(c), the polymer film 203 shrinks as the temperature decreases, and the polymer film 203 applies pressure 204 in a horizontal direction at side facets of the devices 114. As shown in FIG. 6(d), the result is that the bottom 205 of the polymer film 203 is lower than the top 606 of the device 114. As shown in FIG. 6(c), the pressure 204 applied from the side facets allows the devices 114 to be effectively removed from the substrate 101, beginning at the cleaving points 112.

Moreover, the trenches 109 makes the pressure 204 applied by the polymer film 203 more effective at the cleaving point 112 near the interface between the substrate 101 and the III-nitride ELO layers 105. The trenches 109 define the depressed separate regions 111, and allow thinner and wider III-nitride ELO layers 105 to be more effectively removed from the substrate 101.

Thereafter, the temperature increases, for example, to room temperature, and pressure 204 is no longer applied to the polymer film 203. At that time, the devices 114 have been removed from the substrate 101, and the polymer film 203 is then separated from the substrate 101. As shown in FIG. 6(e), when using a polymer film 203, especially a polymer film 203 having an adhesive layer 602, the devices 114 can be removed using the polymer film 203 in an easy and quick manner.

Figure 8B:
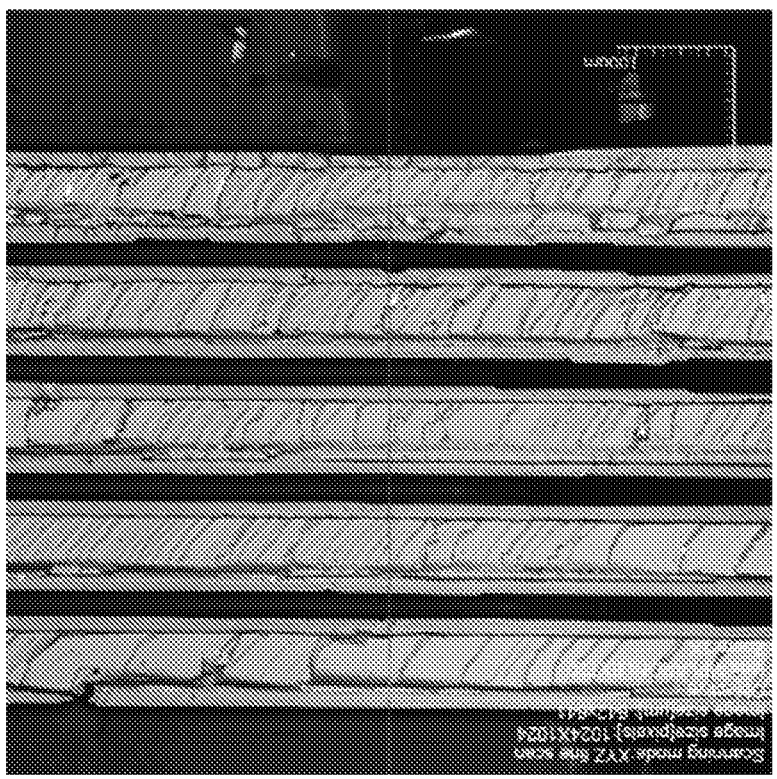
FIG. 8(b) shows a back-side surface of the bars after the removal.
Figure 8A:
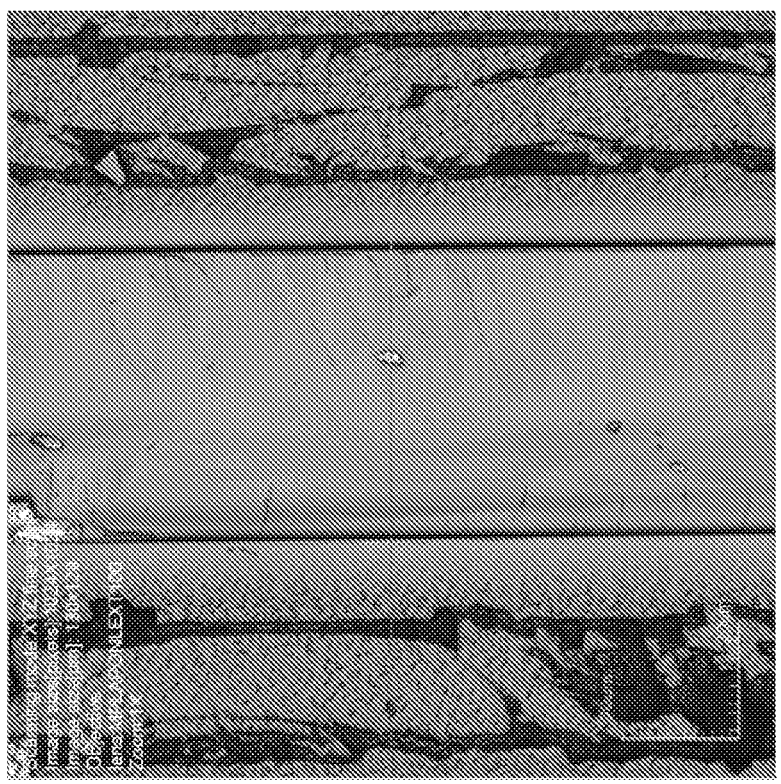
FIG. 8(a) shows that the surface of a substrate with trenches after the removal of bars.

FIG. 8(a) shows that the surface of the substrate 101 with trenches 109 after the removal of the bars from the substrate 101 using the present invention. FIG. 8(b) shows the backside surface of the bars after the removal of the bars from the substrate 101 using the present invention.

The present invention provides other advantages as well. When using an m-plane substrate 101 having a mis-cut orientation towards the c-plane, as shown in FIG. 9(a), the shape of the III-nitride ELO layer 105 is often asymmetric. In this case, an m-plane substrate 101 having a −1 degree mis-cut orientation towards the c-plane is used. In the asymmetric shape case, there is a possibility of having a different right-side height from a left-side height for the island-like III-nitride semiconductor layers 110. The substrate 101 with trenches 109 would be very useful in avoiding these different heights.

Figure 9B:
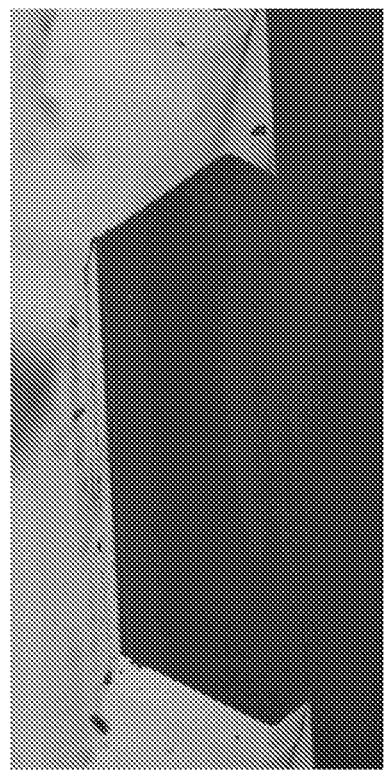
FIGS. 9(a) and 9(b) are images of epitaxial lateral overgrowth layers.
Figure 9A:

Even when using a substrate 101 which has the same mis-cut orientation, this method can obtain a symmetry shape layer, as shown in FIG. 9(b). It is thought that this phenomenon is caused by the differences in supply of material gases to the side facets due to the existence of the trenches 109.

Moreover, this method can be adopted for other materials that can implement a lateral growth, such as GaAs, etc.

Step 9: Fabricating n-Electrodes

Figure 10A:
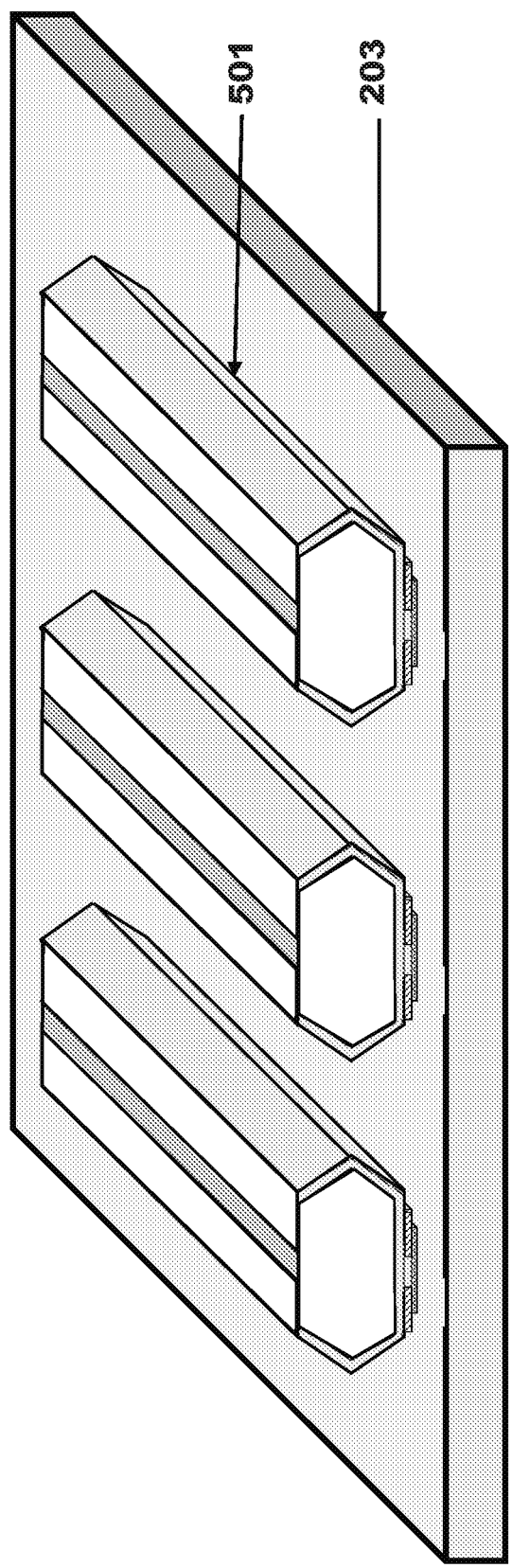
FIGS. 10(a), 10(b), 10(c), 10(d), 10(e), 10(f) are schematics and images that illustrate how n-electrodes are fabricated and bars are broken into devices.
Figure 10B:
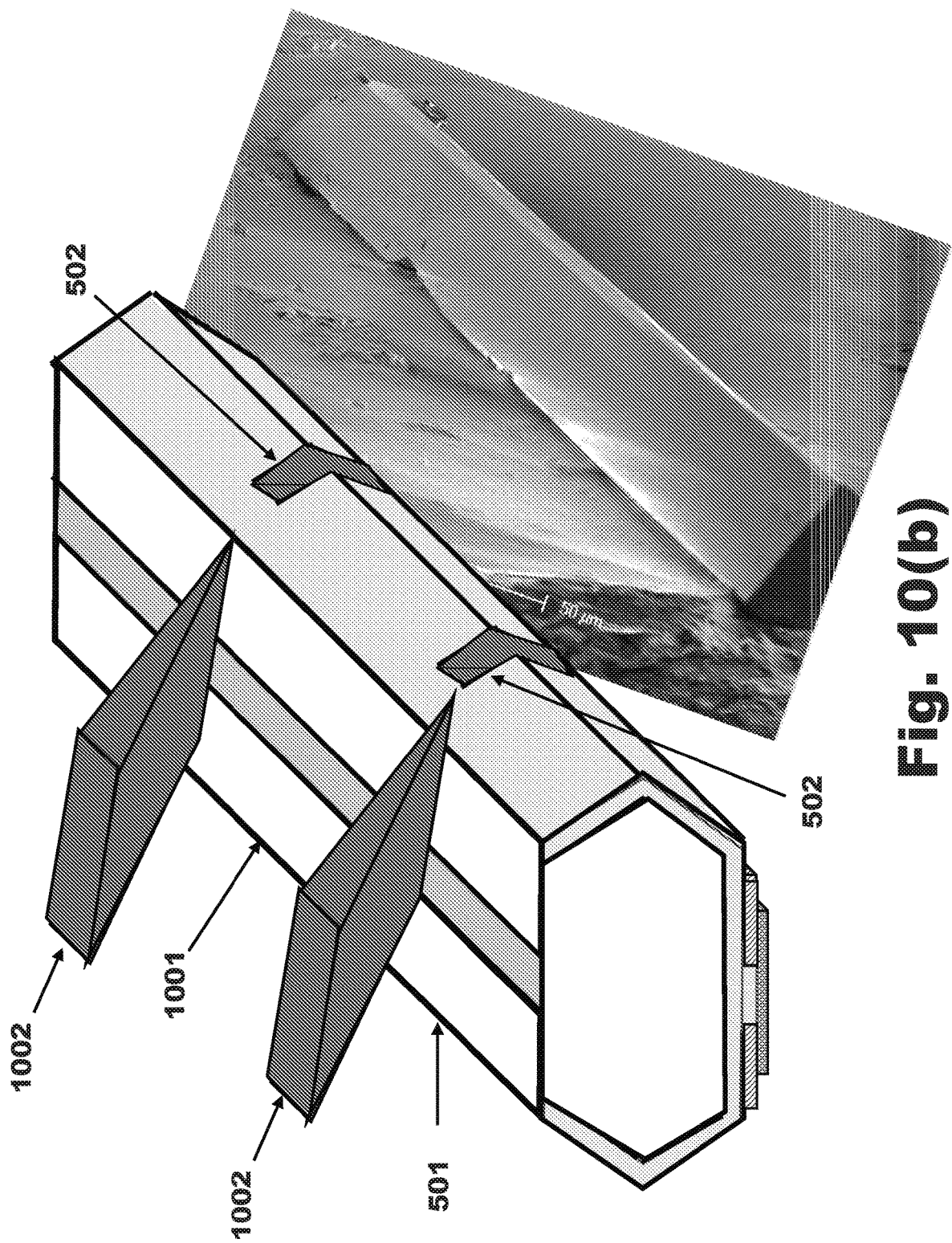

As shown in FIG. 10(a), after removing the bars 501 from the substrate 101, the bars 501 are attached to the polymer film 203 in an upside-down manner. FIG. 10(b) shows the back side of the bars 501, which has a separate area 1001 between dividing support regions 502, wherein cleaving is performed by cleaving blades 1002 at the dividing support regions 502.

Figure 10C:
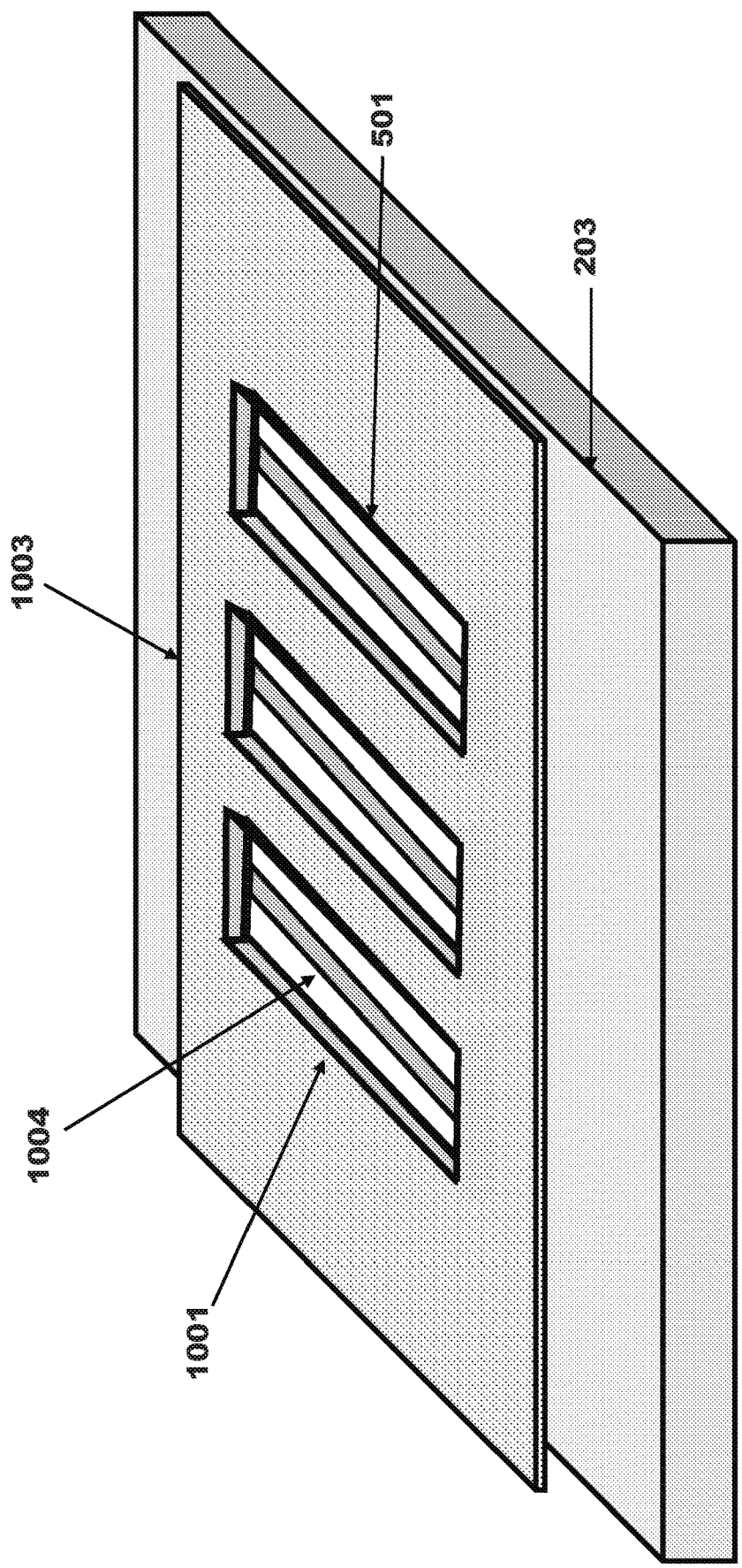

As shown in FIG. 10(c), a metal mask 1003 overlays each of the bars 501 on the polymer film 203, with only the separate region 1001 showing through the mask 1003. An n-electrode 1004 is then disposed on the back side of the bars 501 in the separate area 1001. Generally, the separate area 1001 is kept clean and in good surface condition for the n-electrode 1004 to obtain low contact resistivity. Alternatively, n-electrodes can be disposed on a top surface of the devices 114.

Step 10: Breaking the Bars Into Devices

Figure 10D:
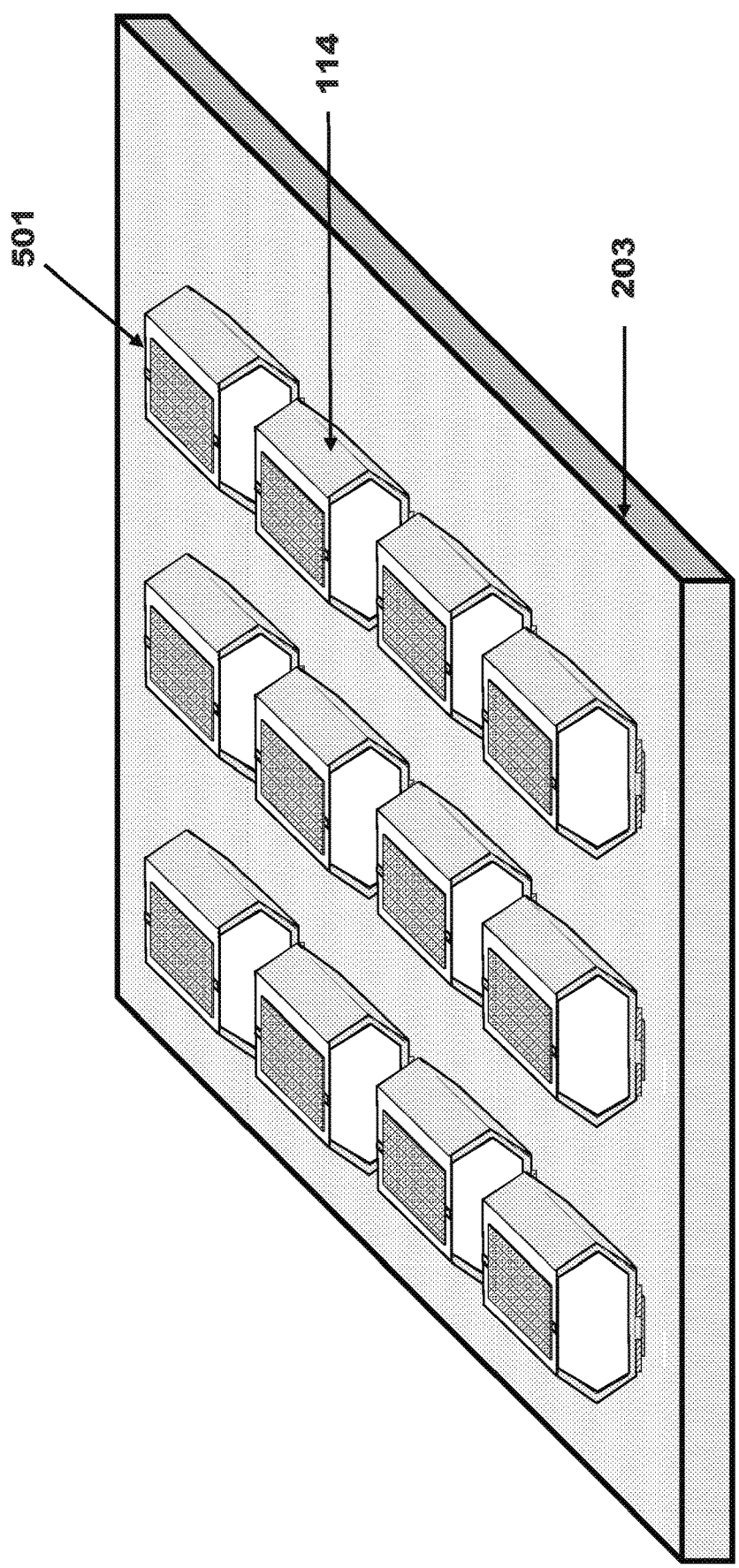

After disposing the n-electrode 1004, each of the bars 501 may be divided into one or more devices 114, as shown in FIG. 10(d). The dividing support region 502 helps divide the bar 501 into the devices 114. A cleaving or breaking method can be used, as well as other methods.

Step 11: Mounting Each Device on a Heat Sink Plate

Figure 10E:
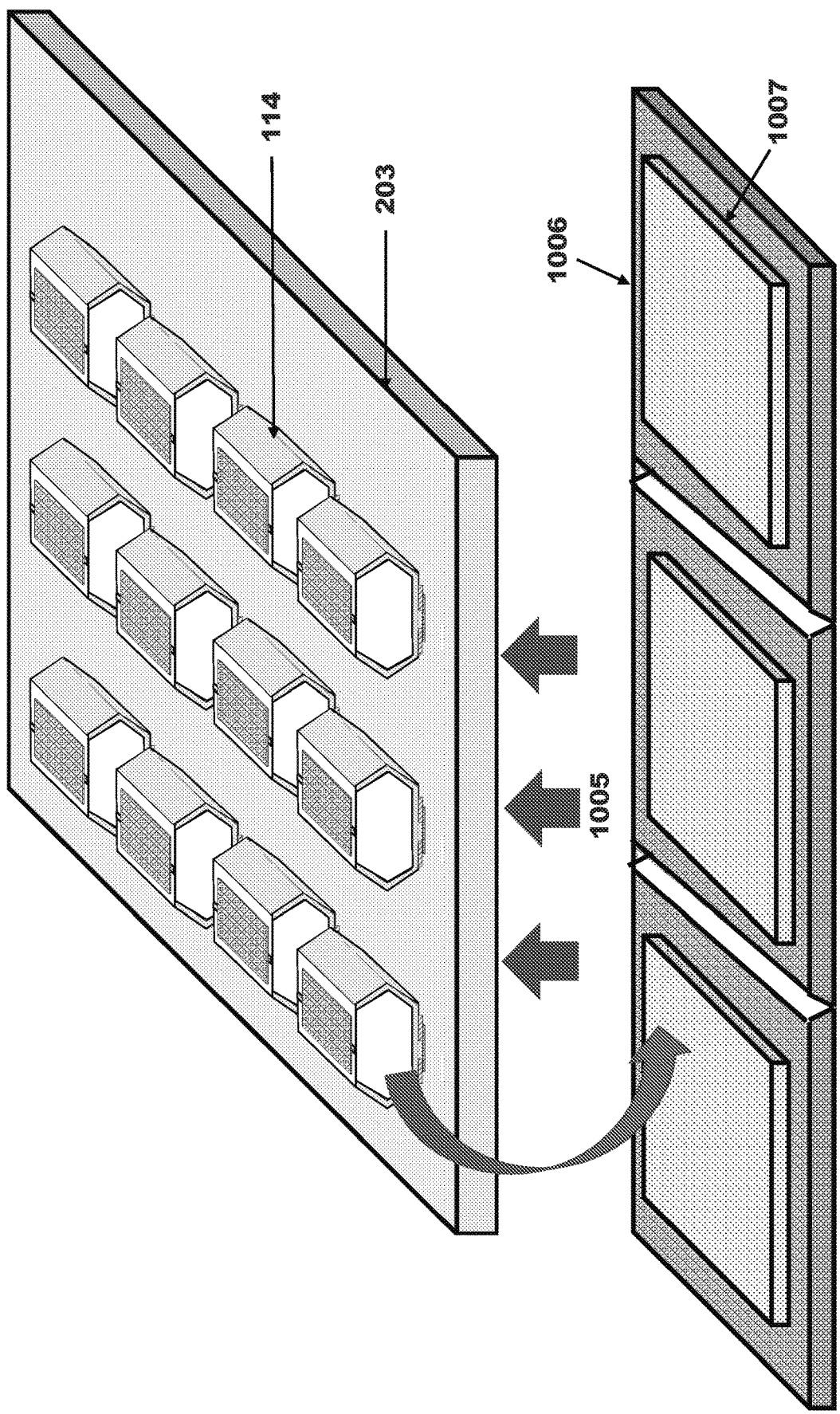

After Step 8, the divided bar 501 is still on the polymer film 203. In one embodiment, the polymer film 203 is a UV-sensitive dicing tape. In this case, the polymer film 203 is exposed to UV (ultraviolet) light 1005, which can reduce the adhesive strength of the polymer film 203, as shown in FIG. 10(e). This makes it easy to remove the devices 114 from the polymer film 203.

Figure 10F:
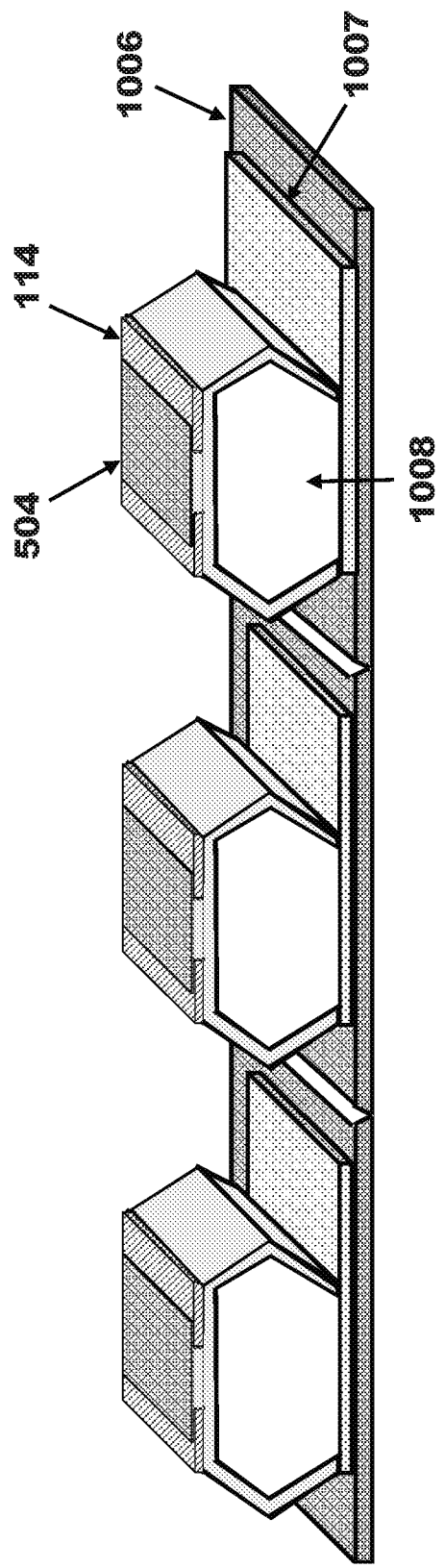

In this case, a heat sink plate 1006 made of AlN is prepared. An Au—Sn solder 1007 is disposed on the heat sink plate 1006, and the devices 114 removed from the polymer film 203 are mounted on the heat sink plate 1006 at the Au—Sn solder 1007. At this time, the heat sink plate 1006, which is heated over the melting temperature of the solder 1007, can mount the devices 114. The devices 114 can be mounted with either the n-electrode 1004 or p-electrode 504 side down. FIG. 10(f) shows the devices 114 mounted to the heat sink plate 1006 with the n-electrode 1004 side down and the p-electrode 504 side up.

Step 12: Coating the Facets of Laser Diode Devices

The next step of device 114 processing comprises coating facets of laser diode devices 114. While a laser diode device 114 is lasing, the light in the device 114 that penetrates through the facets of device 114 to the outside of the device 114 is absorbed by non-radiative recombination centers at the facets, so that the facet temperature increases continuously. Consequently, the temperature increase can lead to catastrophic optical damage (COD) of the facet.

A facet coating can reduce the non-radiative recombination center. To prevent COD, it is necessary to coat the facets using dielectric layers, such as AlN, AlON, $Al_2O_3$, SiN, SiON, $SiO_2$, $ZrO_2$, $TiO_2$, $Ta_2O_5$ and the like. Generally, the coating film is a multilayer structure comprised of the above materials. The structure and thickness of the layers is determined by a predetermined reflectivity.

As shown in FIG. 10(f), the bar 501 of device 114 has been divided in Step 10, to obtain cleaved facets 1008. These facets 1008 can be coated on multiple devices 114 at the same time, in an easy manner. The devices 114 are mounted on the heat sink plate 1006 in a low horizontal position.

Figure 11:
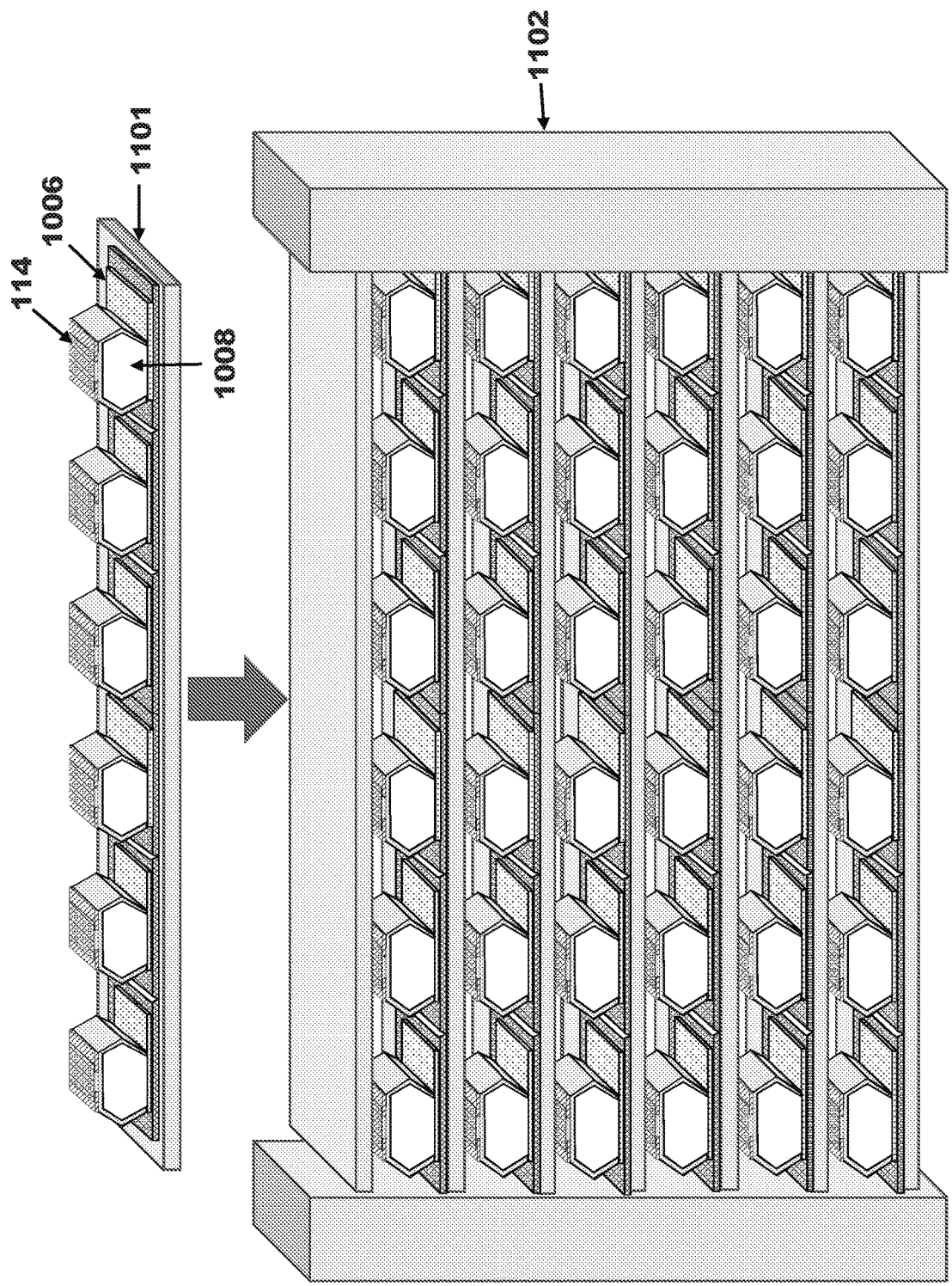
FIG. 11 is a schematic that illustrates how facets are coated for laser diode devices.

As shown in FIG. 11, the heat sink plate 1006 with the devices 114 are mounted on a coating bar 1101, which may be placed on a spacer plate, and a plurality of coating bars 1101 and spacer plates are stored in a coating holder 1102. Note that it is not always necessary to use a spacer plate, and the coating bar 1101 could be used alone.

By doing this, a number of devices 114 can be coated simultaneously. In one embodiment, the coating is conducted at least two times—once for a front facet 1008 and once for a rear facet 1008. The length of the heat sink plate 1006 is set to be almost the cavity length of the laser diode device 114, which makes it easy and quick to perform the coating process two times. Once the coating bar 1101 is set in the coating holder 1102, both facets 1008 can be coated without setting the coating bar 1101 in the coating holder 1102 again. In one embodiment, the first coating is performed on the front facet 1008 which emits the laser light, and the second coating is performed on the rear facet 1008 which reflects the laser light. The coating holder 1102 is reversed before the second coating in the facility that deposits the coating film. This reduces the lead time of the process substantially.

Step 13: Dividing the Devices

Figures 12A, 12B:
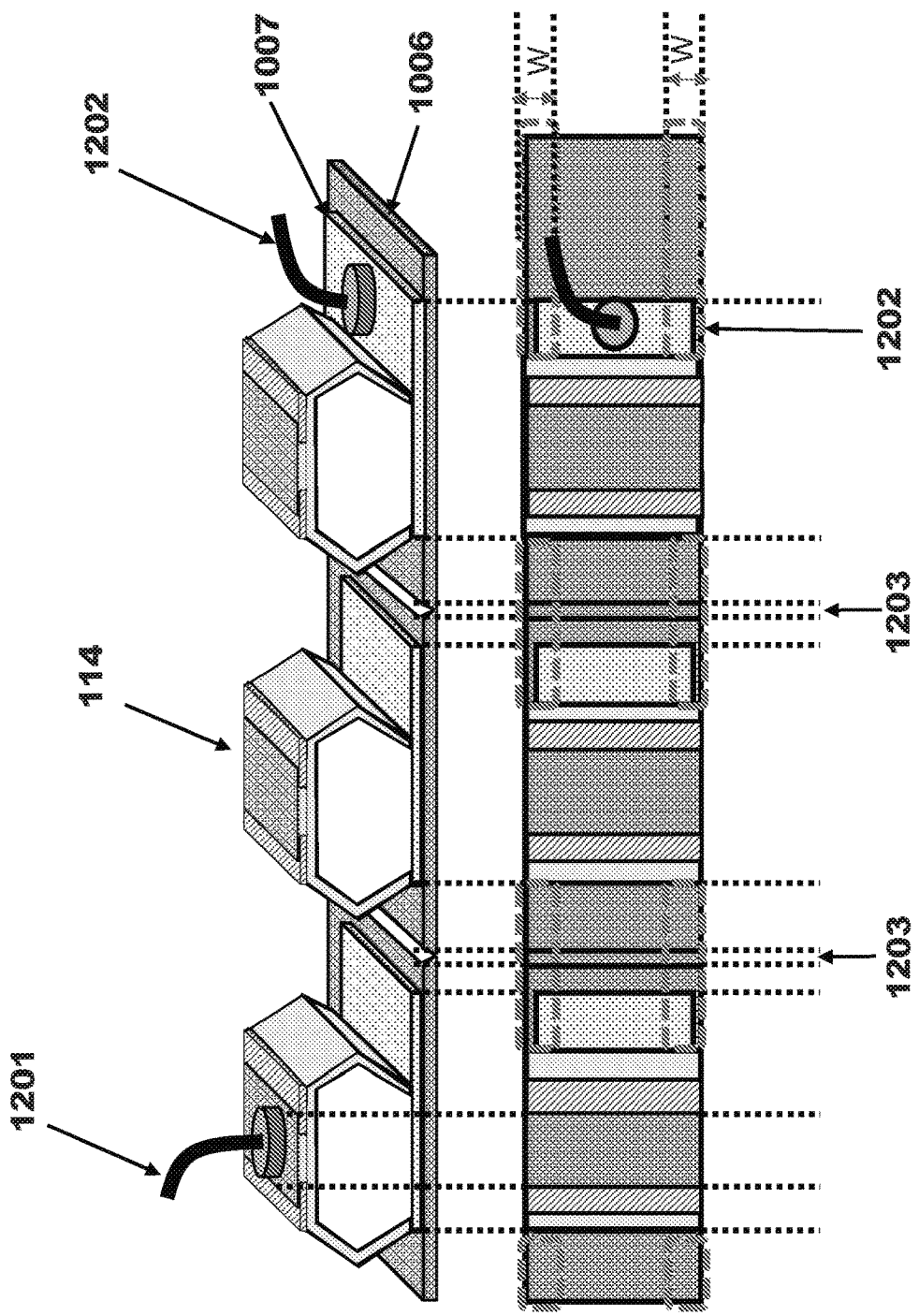
FIGS. 12(a), 12(b) and 12(c) are schematics that illustrate how devices are wire bonded on a heat sink plate.
Figure 12C:
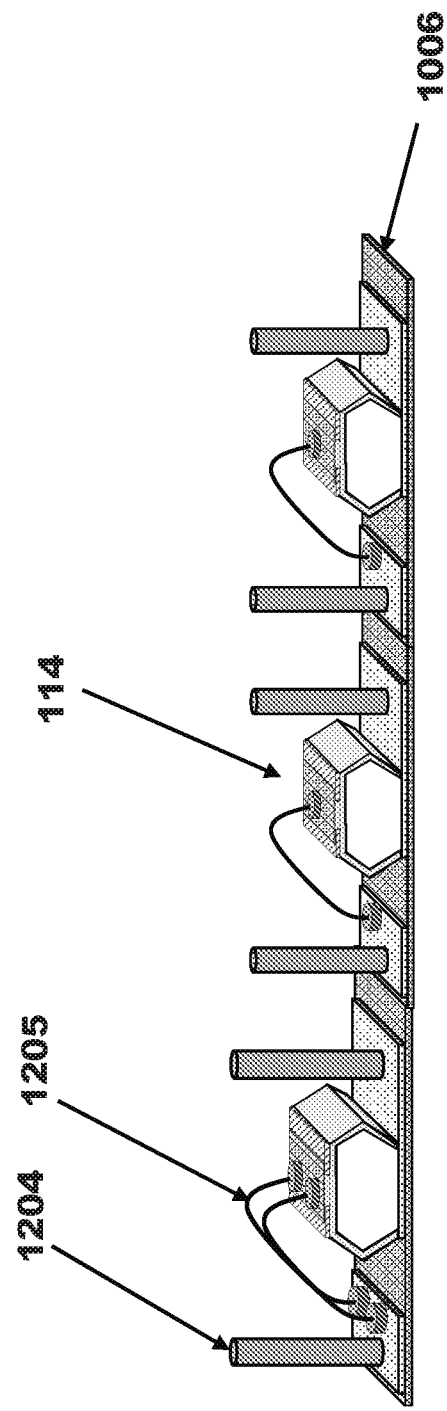

As shown in FIG. 12(*a*), wire bonds 1201 and 1202 are attached to the devices 114, and then the heat sink plate 1006 is divided at trenches 1203, for example, between one or more of the devices 114. FIG. 12(*b*) is a top view of FIG. 12(*a*) that shows the relative placements and positions of the devices 114, trenches 1203 and wire bonds 1201, 1202. FIG. 12(*c*) shows the use of separated probes 1204 and wire bonds 1205 with the devices 114 on the heat sink plate 1006.

FIGS. 13(*a*) and 13(*b*) further show how the heat sink plate 1006 is divided to separate the devices 114, which may occur before or after the attachment of the wire bonds 1002, 1202. By doing this, it is easy to separate the devices 114 after the coating process has been completed.

Step 14: Screening the Devices

This step distinguishes between defective and non-defective devices 114. First, various characteristics of the devices 114 are checked under a given condition; such as output power, voltage, current, resistivity, FFP (Far Field Pattern), slope-efficiency and the like. At this point, the devices 114 have already been mounted on the heat sink plate 1006, so it is easy to check these characteristics.

A testing apparatus 1401 is shown in FIGS. 14(*a*) and 14(*b*), wherein the p-electrode 504 and the solder 1007, which has an electrical continuity to an n-electrode 1004, are contacted by probes 1402, 1403. Then, non-defective devices 114 can be selected and screened by an aging test (life time test).

In one embodiment, it is preferable that testing apparatus 1401 comprise a box or other container, so that an aging test may be conducted with the devices 114 sealed in a dry air or nitrogen atmosphere. Moreover, a heat stage 1404 may be used to maintain the temperature of the devices 114 during the screening test, for example, 60 degrees, 80 degrees and so on. Photodetectors 1405 may be used to measure light output power 1406, which identifies non-defective devices 114 that have a constant output power, or which identifies defective devices 114.

In particularly, in the case of a III-nitride base semiconductor laser diode device 114, it is known that when a laser diode is oscillated in a moisture-containing atmosphere, it deteriorates. This deterioration is caused by moisture and siloxane in the air, so the III-nitride-based semiconductor laser diode device 114 needs to be sealed in dry air during the aging test.

Figure 15:
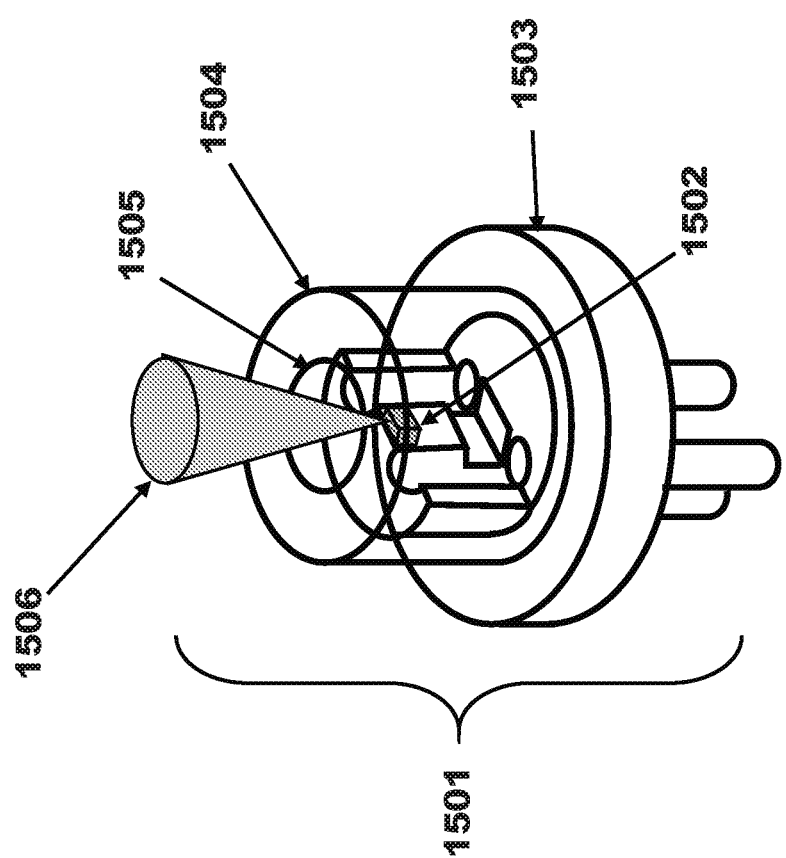
FIG. 15 is a schematic that illustrates how a device is packaged.

Consequently, as shown in FIG. 15, when a III-nitride-based laser diode 1501 is shipped from a manufacturer, the chip 1502 itself is mounted on a stem 1503 and sealed in a dry air atmosphere using a TO-can package 1504, wherein the package 1504 includes a window 1505 for light emission 1506.

Generally speaking, the screening or ageing tests are conducted before shipping, in order to screen out defective devices 114. For example, the screening condition is conducted according to the specifications of the laser diode device 114, such as a high temperature and a high power.

Moreover, an aging test may be conducted with the device 114 mounted on/into the package 1501, with the package 1501 sealed in dry air and/or nitrogen before screening. This fact makes the flexibility of packaging and mounting of the laser device restrictive.

In the prior art, if defective production happens, the defective products are discarded in the whole TO-CAN package 1501, which is a great loss for production. This makes it difficult to reduce the production costs of laser diode devices 114. There is a need to detect defective devices 114 at an earlier step.

In the present invention, coating the facets 1008 of the device 114 using a heat sink plate 1006, on which can be mounted a plurality of the devices 114 in a low horizontal position and then, after the coating process, dividing the heat sink plate 1006 and the devices 114 using the trenches 1203, allows the devices 114, with the sub-mount of the heat sink plate 1006, to be checked in the screening test in a dry air or nitrogen atmosphere.

When doing the screening test, the devices 114 already has two contacts, namely the p-electrode 504 and the solder 1007 on the heat sink plate 1006, or in the case of flip-chip bonding, the n-electrode 1004 and the solder 1007 on the heat sink plate 1006. Moreover, the present invention can select defective products using the screening test, when the device 114 is only comprised of the chip and the sub-mount. Therefore, in the case of discarding the defective products, the present invention can reduce the loss more than the prior art, which has great value.

In the case of screening of high power laser diode devices 114, it may be preferable that the heat sink plate 1006 has two parts of solder 1007 disposed without electrical continuity. One part of solder 1007 is connected to the p-electrode 504 with a wire (not shown), and another part of solder 1007 is connected to the n-electrode 1004 with a wire (not shown). Moreover, it may be preferable that the p-electrode 504 and n-electrode 1004 are connected by two or more wires to the solder parts 1007, for example, as shown in FIG. 12(*c*), which shows the p-electrode 504 connected by two or more wires 1205 to the solder 1007. In this way, the probes 1204 for applying current to the device 114 can avoid contacting the p-electrode 504 (or n-electrode 1004) directly, which, in the case of screening of a high-power laser diode devices 114, is critical. Specifically, the probes 1204 could break the contacted parts, in particular, in the case of applying a high current density.

Step 15: Mounting the Devices on or Into the Packages

Figure 16:
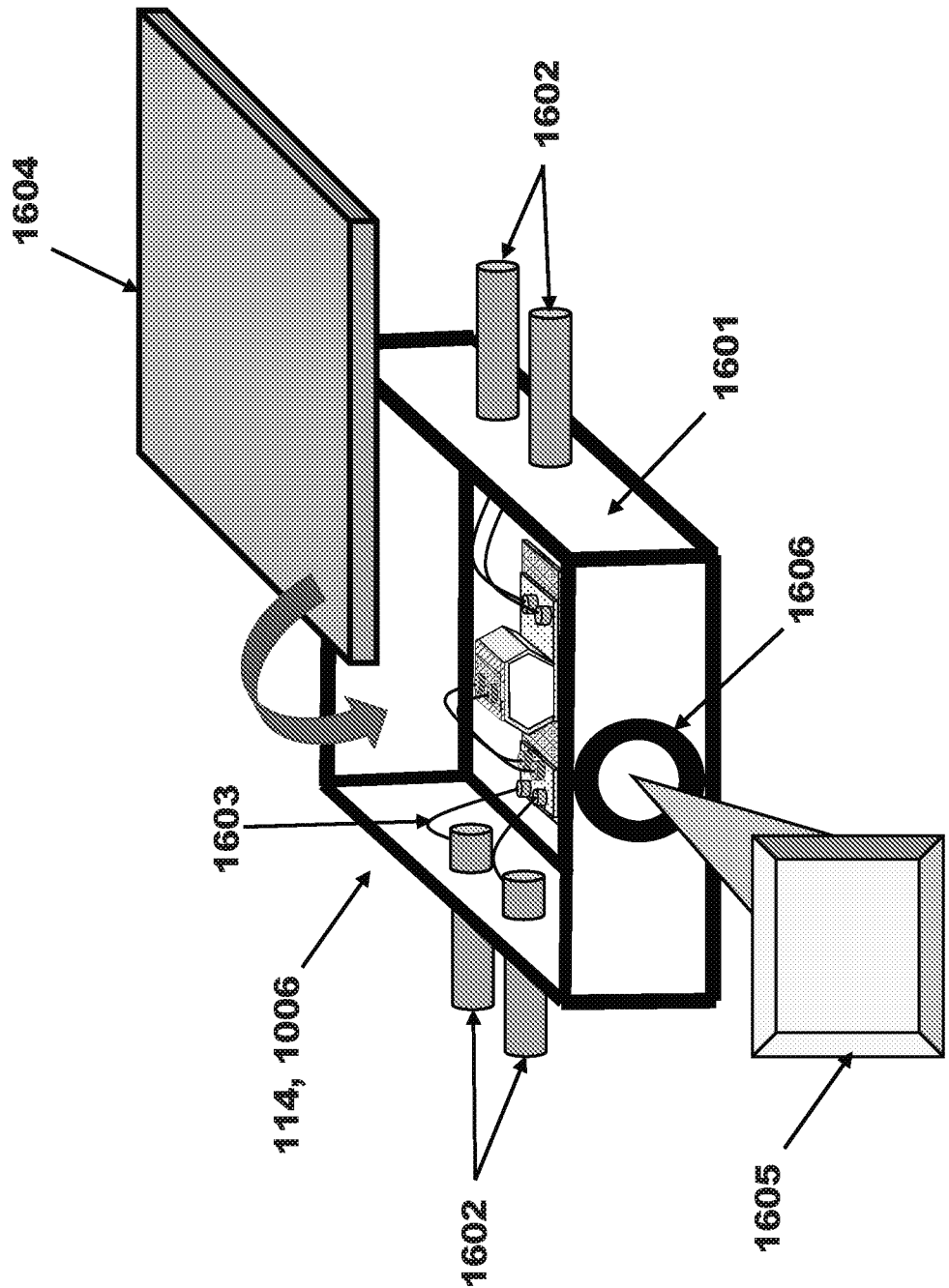
FIG. 16 is a schematic that illustrates how a device is mounted.

As shown in FIG. 16, the device 114 (including the heat sink plate 1006) may be mounted in a package 1601 using solder or another metal to bond the device 114 at the bottom of the package 1601. Pins 1602 of the package 1601 are connected to the device 114 by wires 1603. By doing this, current from an external power supply can be applied to the device 114.

This is more preferable than bonding between the package 1601 and the heat sink plate 1006 using a metal, such as Au—Au, Au—In, etc. This method requires a flatness at the surface of package 1601 and at the back side of the heat sink plate 1006. However, without the solder 1007, this configuration accomplishes a high thermal conductivity and low temperature bonding, which are big advantages for the device 114 process.

Thereafter, a lid 1604 may enclose the package 1601. Moreover, a phosphor 1605 can be set outside and/or inside the package 1601, with a window 1606 allow the light emission to exit the package 1601. By doing this, the package 1601 can be used as a light bulb or a head light of an automobile.

As set forth herein, these processes provide improved methods for obtaining a laser diode device 114. In addition, once the device 114 is removed from the substrate 101, the substrate 101 can be recycled a number of times. This accomplishes the goals of eco-friendly production and low-cost modules. These devices 114 may be utilized as lighting devices, such as light bulbs, data storage equipment, optical communications equipment, such as Li—Fi, etc.

It is difficult to package with a plurality of different types of laser devices 114 in one package 1601. However, this method can overcome this issue, due to being able to perform an aging test without the packaging. Therefore, it is easy to mount the different types of devices 114 in one package 1601.

Alternative Embodiments

Following are alternative embodiments for fabricating the devices 114 according to the present invention.
First Embodiment In a first embodiment, a freestanding m-plane GaN substrate 101 is used, wherein the substrate 101 has a mis-cut orientation with −1 degree towards a c-axis.
Second Embodiment In a second embodiment, the substrate 101 comprises a III-nitride substrate 101, which may include various off-angle substrates, wherein the III-nitride ELO layers 105 are GaN layers.
Third Embodiment In a third embodiment, a different mount type is used, namely, a flip-chip method. In the flip-chip method, the area of the device 114 in contact with the heat sink plate 1006 can be large for improved thermal conductivity. In addition, due to the substantially symmetric shape of the III-nitride ELO layer 105 formed using the present invention, the top surface of the device 114 is horizontal and flatter.

DEFINITIONS OF TERMS

III-Nitride-Based Substrate

As long as a III-nitride-based substrate 101 enables growth of a III-nitride-based semiconductor layer through a growth restrict mask 102, any GaN substrate 101 that is sliced on a {0001}, {11-22}, {1-100}, {20-21}, {20-2-1}, {10-11}, {10-1-1} plane, etc., or other plane, from a bulk GaN and AlN crystal can be used.

Hetero-Substrate

Moreover, the present invention can also use a hetero-substrate 101 for the device 114. For example, a GaN template 113 or other III-nitride-based semiconductor layer 113 may be grown on a hetero-substrate 101, such as sapphire, Si, GaAs, SiC, etc., for use in the present invention. The GaN template 113 or other III-nitride-based semiconductor layer 113 is typically grown on the hetero-substrate 101 to a thickness of about 2-6 μm, and then the growth restrict mask 102 is disposed on the GaN template 113 or other III-nitride-based semiconductor layer 113.

Growth Restrict Mask

The growth restrict mask 102 comprises a dielectric layer, such as $SiO_2$, SiN, SiON, $Al_2O_3$, AlN, AlON, MgF, $ZrO_2$, etc., or a refractory metal or precious metal, such as W, Mo, Ta, Nb, Rh, Ir, Ru, Os, Pt, etc. The growth restrict mask 102 may be a laminate structure selected from the above materials. It may also be a multiple-stacking layer structure chosen from the above materials.

The growth restrict mask 102 is deposited by sputter, electron beam evaporation, plasma-enhanced chemical vaper deposition (PECVD), ion beam deposition (IBD), etc., but is not limited to those methods.

In one embodiment, the thickness of the growth restrict mask 102 is about 0.05-3 μm. The width of the mask 102 is preferably larger than 20 μm, and more preferably, the width is larger than 40 μm.

Figure 3:
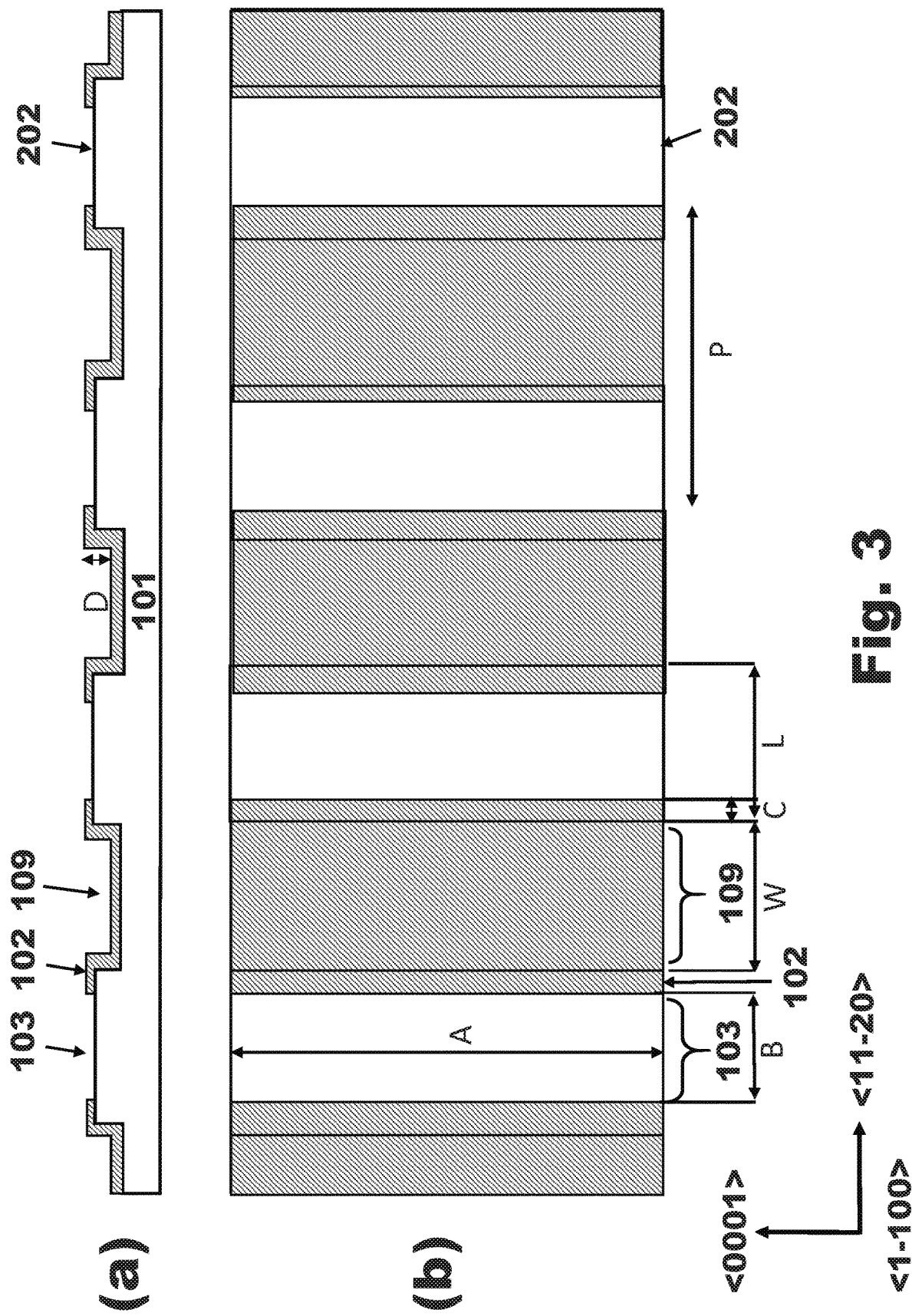
FIGS. 3(a) and 3(b) are schematics that illustrate the structure of trenches formed in the substrate.

The growth restrict mask 102 shown in FIGS. 3(*a*) and 3(*b*) comprises a plurality of opening areas 103, which are arranged in a first direction parallel to the 11-20 direction of the (1-100) plane-oriented III-nitride-based semiconductor substrate 101 and a second direction parallel to the 0001 direction of the III-nitride-based semiconductor substrate 101, periodically at intervals p, extending in the second direction.

The growth restrict mask 102 may or may not partly cover the remaining surface regions 202, which helps in removing each bar of the devices 114 from the substrate 101. The length C of the covered area of the remaining surface regions 202 may be 0 to 0.4 μm or more in order to facilitate removal of the bars of the devices 114.

Direction of the Growth Restrict Mask

On an m-plane free standing GaN substrate 101, the striped opening areas 103 are arranged in a first direction parallel to the 11-20 direction (a-axis) of the III-nitride semiconductor layers 105, 106, 110, and a second direction parallel to the 0001 direction (c-axis) of the III-nitride semiconductor layers 105, 106, 110, periodically at a first interval and a second interval, respectively, and extend in the second direction.

On a c-plane free standing GaN substrate 101, the striped opening areas 103 are arranged in a first direction parallel to the 11-20 direction (a-axis) of the III-nitride semiconductor layers 105, 106, 110, and a second direction parallel to the 1-100 direction (m-axis) of the III-nitride semiconductor layers 105, 106, 110, periodically at a first interval and a second interval, respectively, and extend in the second direction.

On a semipolar (20-21) or (20-2-1) GaN substrate 101, the opening areas 103 are arranged in a direction parallel to [−1014] and [10-14], respectively.

Alternatively, a hetero-substrate 101 can be used. When a c-plane GaN template 113 is grown on a c-plane sapphire substrate 101, the opening areas 103 are in the same direction as the c-plane free-standing GaN substrate 101; when an m-plane GaN template 113 is grown on an m-plane sapphire substrate 101, the opening areas 103 are in the same direction as the m-plane free-standing GaN substrate 101. By doing this, an m-plane cleaving plane can be used for dividing the bars 501 of the devices 114 with the c-plane GaN template 113, and a c-plane cleaving plane can be used for dividing the bars 501 of the devices 114 with the m-plane GaN template 113; which is much preferable.

The width of the striped opening areas 103 is typically constant in the second direction, but may be changed in the second direction as necessary.

III-Nitride-Based Semiconductor Layers

The III-nitride ELO layers 105, the III-nitride semiconductor device layers 106 and the island-like III-nitride semiconductor layers 110 can include In, Al and/or B, as well as other impurities, such as Mg, Si, Zn, O, C, H, etc.

The III-nitride semiconductor device layers 106 generally comprise more than two layers, including at least one layer among an n-type layer, an undoped layer and a p-type layer. The III-nitride semiconductor device layers 106 specifically comprise a GaN layer, an AlGaN layer, an AlGaInN layer, an InGaN layer, etc.

The distance between the island-like III-nitride semiconductor layers 110 adjacent to each other, which is the no-growth region 104, is generally 30 µm or less, and preferably 10 µm or less, but is not limited to these figures.

Flat Surface Region and Layer Bending Regions

The flat surface region 107 is between layer bending regions 108 at the edges of the III-nitride ELO layers 105. Furthermore, the flat surface region 107 is on the growth restrict mask 102.

Fabrication of the semiconductor device 114 is mainly performed on the flat surface region 107. The width of the flat surface region 107 is preferably at least 5 µm, and more preferably is 10 µm or more. The flat surface region 107 has a high uniformity of thickness for each of the semiconductor layers 105, 106, 110 in the flat surface region 107.

It is not a problem if the fabrication of the semiconductor device 114 is partly formed on the layer bending regions 108. More preferably, the layers at the layer bending regions 108 are removed by etching. For example, it is better that at least a part of an active layer in the layer bending region 108 is removed using an etching process, such as dry etching or wet etching.

Polymer Film

In one embodiment, the polymer film 203 is a dicing tape, such as a UV-sensitive dicing tape. The polymer film 203 may comprise a multi-layer film 203, such as shown in FIGS. 6(a), 6(b) and 6(c), which includes a base film 601 material, for example, having a thickness of about 80 µm, may be made of polyvinyl chloride (PVC); an adhesive layer 602, for example, having a thickness of about 15 µm, may be made of acrylic UV-sensitive adhesive; and a backing film 603 material, for example, having a thickness of about 38 µm, may be made of polyethylene terephthalate (P.E.T.). When the polymer film 203 is a UV-sensitive dicing tape and is exposed the UV light, the stickiness of the adhesive is drastically reduced, making it easy to remove devices 114 from the polymer film 203.

Heat Sink Plate

As described above, when removed, the bars 501 of the devices 114 are transferred to the heat sink plate 1006, which may be AlN, SiC, Si, Cu, CuW, and the like. As shown in FIG. 10(e), the solder 1007 for bonding, which may be Au—Sn, Su—Ag—Cu, Ag paste, and the like, is disposed on the heat sink plate 1006. Then, an n-electrode or p-electrode is bonded to the solder 1007. The devices 114 can also be flip-chip bonded to the heat sink plate 1006.

In the case of bonding LED devices 114 to the heat sink plate 1006, the size of the heat sink plate 1006 does not matter, and it can be designed as desired.

In the case of bonding LD devices 114 to the heat sink plate 1006, it is preferable that the length of the heat sink plate 1006 be the same or shorter than the length of the LD devices 114 for the facets coating process, wherein the length of the LD devices 114 is almost the same as the length of the laser cavity. By doing this, it is easy to coat both facets 1008 of laser cavity. If the length of the heat sink plate 1006 is longer than laser cavity, then the heat sink plate 1006 may prevent uniform coating of the laser facets 1008.

Long Width Heat Sink Plate

A long width for the heat sink plate 1006 makes the process of fabricating the laser diode devices 114 more productive. As shown in FIG. 11, the heat sink plate 1006, which is placed on a coating bar 1101 and possibly a spacer plate, and then stacked with other coating bars 1101 and spacer plates in the coating holder 1102 for coating a plurality of the devices 114 at the same time. Consequently, s single coating process can coat a lot of devices 114.

Heat Sink Plate with Trenches

It is preferable that the heat sink plate 1006 have trenches 1203 for dividing the devices 114, as shown in FIG. 12(b). This structure is useful after the facet coating process, where the heat sink plate 1006 is divided into one or more devices 114, for example, single devices 114 or an array of devices 114. After dividing the heat sink plate 1006, the devices 114 can be fabricated into modules, such as lighting modules. The trenches 1203 in the heat sink plate 1006 guide the division into the devices 114.

The trenches 1203 can be formed by a wet etching method and mechanically processed before the devices 114 are mounted. For example, if the heat sink plate 1006 is made of silicon, wet etching can be used to form the trenches 1203. Using the trenches 1203 in this manner, reduces the lead time of the process.

Heat Sink Plate with Solder

It is preferable that the length of solder 1007 be shorter than the device 114 length on the heat sink plate 1006, as shown in FIG. 10(f). This prevents any wraparound of the solder 1007 to the facets 1008, which could cause a deterioration of the device 114 characteristics. In particular, wraparound should be avoided for flip-chip mounting.

As shown in FIG. 12(b), after the coating process, the coating bar has wraparound areas, which are the areas surrounded by the dashed lines. The wraparound area has a width W of about 10-20 µm. The coating film will have coated these areas. It is also difficult to avoid coating the solder 1007 with the coating film. Generally, the coating film is selected from one or more dielectric materials, which is why this area does not have conductivity. This is a problem for both conductivity and adhesiveness when a wire is bonded to the solder 1007.

Therefore, it is preferable that the wire be placed to avoid the wraparound area. At least, the place of wire bonding should be about 25 µm away from the edge of the heat sink plate 1006.

Semiconductor Devices

The semiconductor device 114 is, for example, a Schottky diode, a light-emitting diode, a semiconductor laser, a photodiode, a transistor, etc., but is not limited to these devices. This invention is particularly useful for micro-LEDs and laser diodes, such as edge-emitting lasers and vertical cavity surface-emitting lasers (VCSELs). This invention is especially useful for a semiconductor laser which has cleaved facets.

Fabricating an LED Device

In the case of fabricating an LED device 114, the same process may be used until Step 6. This discussion explains briefly how to make two types of LEDs. A type 1 LED has two electrodes (a p-electrode and an n-electrode) on one side of the chip, whereas a type 2 LED has an electrode on opposite sides of chip.

First, in the case of the type 1 LED, the p-electrode and n-electrode are formed in Step 6 on the top surface of the device 114. Then, the bars 501 of the devices 114 are removed as described in Step 8, and the removed devices 114 are mounted on the heat sink plate 1006.

Second, in the case of the type 2 LED, almost the same process is used until Step 6, where an ITO electrode is formed on a p-GaN contact layer of the device 114. Moreover, it is preferable that the layer bending regions 108 be eliminated.

Process Flowchart

Figure 17:
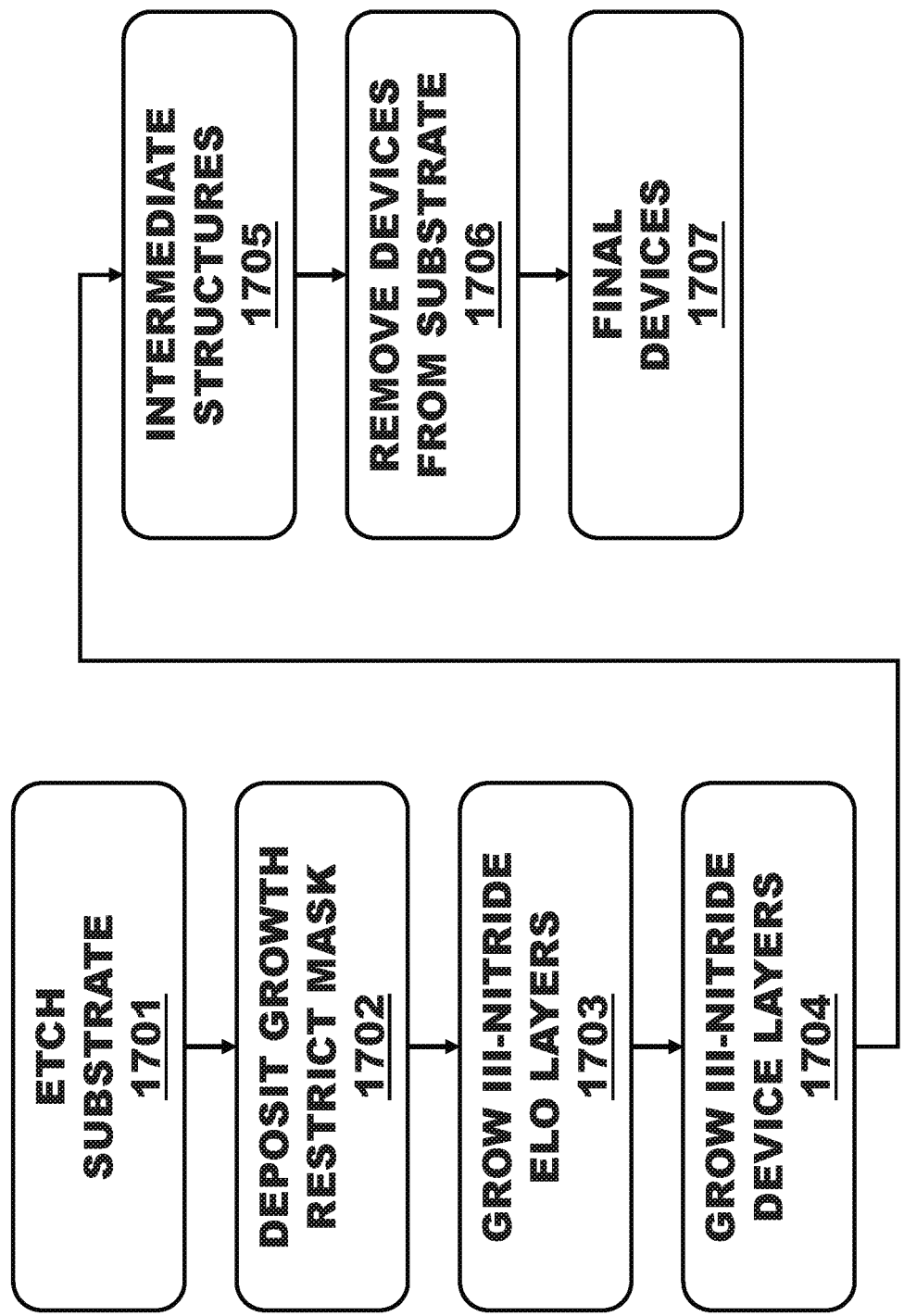
FIG. 17 is a flowchart that illustrates the processing steps performed by the present invention.

FIG. 17 is a flowchart that illustrates the device fabrication process described above, wherein the final block of the flowchart represents the resulting product of the device fabrication process, namely, one or more III-nitride based semiconductor devices fabricated according to this method, as well as a substrate that has been removed from the devices and is available for recycling and reuse.

Block 1701 represents the step of etching a substrate to form one or more trenches on a surface of the substrate.

Block 1702 represents the step of depositing a growth restrict mask on or above the substrate, including at least partially on or in the trenches, wherein the growth restrict mask has one or more opening areas where the surface of the substrate is exposed. The etching of the substrate to form the trenches on the surface of the substrate may result in one or more remaining surface regions of the substrate, and the growth restrict mask may be deposited on at least a portion of the remaining surface regions of the substrate, wherein the portion of the remaining surface regions comprises an edge of the remaining surface regions. The growth restrict mask deposited on the portion of the remaining surface regions determines where cleaving should start to remove the devices from the substrate.

Block 1703 represents the step of growing one or more III-nitride ELO layers on the surface of the substrate at the opening areas of the growth restrict mask, wherein the III-nitride ELO layers have a depressed separate region formed by the trenches in the substrate. The growth restrict mask deposited in the trenches may have one or more of the opening areas in the trenches, wherein the III-nitride ELO layers may be grown at the opening areas in the trenches. The III-nitride ELO layers are grown from the opening areas of the growth restrict mask without coalescing, leaving no-growth regions between separate islands of the III-nitride ELO layers. The trenches may result in a symmetric shape for the separate islands of the III-nitride ELO layers, and the symmetric shape for the separate islands of the III-nitride ELO layers results in the devices being suitable for flip-chip bonding. A surface of the depressed separate regions may be higher than a bottom of the III-nitride ELO layers, wherein one or more cleaving points are located higher than the bottom of the III-nitride ELO layers, such that a force is applied to the cleaving points for removal of the devices from the substrate.

Block 1704 represents the step of growing one or more III-nitride semiconductor device layers on the III-nitride ELO layers to create one or more island-like III-nitride semiconductor layers on which one or more opto-electronic devices are fabricated.

Block 1705 represents results from the process, which may include intermediate structures fabricated according to steps 1701-1704. For example, the intermediate structures may include a substrate etched to form one or more trenches on a surface of the substrate; a growth restrict mask deposited on or above the substrate, including at least partially on or in the trenches, wherein the growth restrict mask has opening areas where the surface of the substrate is exposed; one or more III-nitride ELO layers grown on the surface of the substrate at the opening areas of the growth restrict mask, wherein the III-nitride ELO layers have a depressed separate region formed by the trenches in the substrate; and one or more III-nitride semiconductor device layers grown on the III-nitride ELO layers to create island-like III-nitride semiconductor layers on which one or more opto-electronic devices are fabricated.

Block 1706 represents the step of removing the opto-electronic devices from the substrate using the trenches.

Block 1707 represents results from the process, which may include final devices fabricated according to steps 1701-1706. For example, the final devices may comprise one or more III-nitride ELO layers grown on a surface of a substrate at one or more opening areas of a growth restrict mask, wherein the substrate includes one or more trenches on a surface of the substrate and the III-nitride ELO layers have a depressed separate region formed by the trenches in the substrate; and one or more III-nitride semiconductor device layers grown on the III-nitride ELO layers to create island-like III-nitride semiconductor layers on which one or more opto-electronic devices are fabricated.

Advantages and Benefits

The present invention provides a number of advantages and benefits:

Expensive III-nitride based substrates 101 can be reused after the substrates 101 are removed from the device 114 layers.

High quality layers 105, 106, 110 may be obtained using a substrate 101 of the same or similar materials, with a very low defect density.

Using the same or similar materials for both the substrate 101 and the layers 105, 106, 110 can reduce the strain in the layers 105, 106, 110.

Using materials with the same or similar thermal expansion for both the substrate 101 and the layers 105, 106, 110 can reduce bending of the substrate 101 during epitaxial growth.

Layers 105 grown by ELO are of high quality.

The III-nitride ELO layers 105 do not coalesce with each other, and internal strain is released, which helps to avoid any occurrences of cracks. For device layers 106 that are AlGaN layers, this is very useful, especially in the case of high Al content layers.

The island-like III-nitride based semiconductor layers 110 are formed in isolation, so tensile stress or compressive stress does not fall upon other island-like III-nitride based semiconductor layers 110.

Also, the growth restrict mask 102 and the III-nitride ELO layers 105 are not bonded chemically, so the stress in the III-nitride ELO layers 105 and additional device layers 106 can be relaxed by a slide caused at the interface between the growth restrict mask 102 and the III-nitride ELO layers 105.

The existence of the no-growth regions 104 between each of the island-like III-nitride based semiconductor layers 110 provides flexibility, and the substrate 101 is easily deformed when external force is applied and can be bent. Therefore, even if there occurs a slight warpage, curvature, or deformation in the substrate 101, this can be easily corrected by a small external force, to avoid the occurrence of cracks. As a result, the handling of the substrates 101 by vacuum chucking is possible, which makes the manufacturing process of the semiconductor devices more easily carried out.

The no-growth region 104 makes it is easy to dissolve a large area of the growth restrict mask 102.

Layers 105, 106, 110 of high quality semiconductor crystal can be grown by suppressing the curvature of the substrate 101, and further, even when the layers 105, 106, 110 are very thick, the occurrences of cracks, etc., can be suppressed, and thereby a large-area semiconductor device can be easily realized.

The fabrication method can also be easily adopted to large size wafers (>2 inches).

Modifications and Alternatives

A number of modifications and alternatives can be made without departing from the scope of the present invention.

For example, the present invention may be used with III-nitride substrates 101 of other orientations. Specifically, the substrates 101 may be basal nonpolar m-plane {1 0 -1 0} families; and semipolar plane families that have at least two nonzero h, i, or k Miller indices and a nonzero 1 Miller index, such as the {2 0 -2 -1} planes. Semipolar substrates 101 of (20-2-1) are especially useful, because of the wide area of flattened ELO growth.

In another example, the present invention is described as being used to fabricate different opto-electronic device structures, such as a light-emitting diode (LED), laser diode (LD), Schottky barrier diode (SBD), or metal-oxide-semiconductor field-effect-transistor (MOSFET). The present invention may also be used to fabricate other opto-electronic devices, such as micro-LEDs, vertical cavity surface emitting lasers (VCSELs), edge-emitting laser diodes (EELDs), and solar cells.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method, comprising:
    etching a substrate toform one or more trenches on a surface of the substrate;
    depositing a growth restrict mask on or above the substrate, including at least partially on or in the trenches, wherein the growth restrict mask has one or more opening areas where the surface of the substrate is exposed;
    growing one or more III-nitride epitaxial lateral overgrowth (ELO) layers on the surface of the substrate at the opening areas of the growth restrict mask, wherein the III-nitride ELO layers have a depressed separate region formed by the trenches in the substrate;
    growing one or more III-nitride semiconductor device layers on the III-nitride ELO layers to create one or more island-like III-nitride semiconductor layers on which one or more opto-electronic devices are fabricated;
    removing the growth restrict mask, and
    then removing the opto-electronic devices from the substrate.

2. The method of claim 1, wherein the growth restrict mask deposited in the trenches has one or more of the opening areas in the trenches.

3. The method of claim 2, wherein the III-nitride ELO layers are grown at the opening areas in the trenches.

4. The method of claim 1, wherein the etching of the substrate to form the trenches on the surface of the substrate results in one or more remaining surface regions of the substrate.

5. The method of claim 4, wherein the growth restrict mask is deposited on at least a portion of the remaining surface regions.

6. The method of claim 5, wherein the portion of the remaining surface regions comprises an edge of the remaining surface regions.

7. The method of claim 5, wherein the growth restrict mask deposited on the portion of the remaining surface regions determines where cleaving should start to remove the devices from the substrate.

8. The method of claim 1, wherein the III-nitride ELO layers are grown from the opening areas of the growth restrict mask without coalescing, leaving no-growth regions between separate islands of the III-nitride ELO layers.

9. The method of claim 8, wherein the trenches result in a symmetric shape for the separate islands of the III-nitride ELO layers, and the symmetric shape for the separate islands of the III-nitride ELO layers results in the devices being suitable for flip-chip bonding.

10. The method of claim 1, wherein a surface of the depressed separate regions is higher than a bottom of the III-nitride ELO layers.

11. The method of claim 10, wherein one or more cleaving points are located higher than the bottom of the III-nitride ELO layers, such that a force is applied to the cleaving points for removal of the devices from the substrate.

* * * * *